(12) United States Patent
Minato et al.

(10) Patent No.: US 11,264,533 B2
(45) Date of Patent: Mar. 1, 2022

(54) METHOD OF MANUFACTURING LIGHT-EMITTING MODULE AND LIGHT-EMITTING MODULE

(71) Applicant: NICHIA CORPORATION, Anan (JP)

(72) Inventors: Eiko Minato, Anan (JP); Koji Taguchi, Anan (JP); Yumiko Kameshima, Anan (JP); Masaaki Katsumata, Anan (JP)

(73) Assignee: Nichia Corporation, Anan (JP)

( * ) Notice: Subject to any disclaimer, the term of this patent is extended or adjusted under 35 U.S.C. 154(b) by 0 days.

(21) Appl. No.: 16/857,959

(22) Filed: Apr. 24, 2020

(65) Prior Publication Data
US 2020/0343407 A1 Oct. 29, 2020

(30) Foreign Application Priority Data

Apr. 26, 2019 (JP) .............................. JP2019-085494
Nov. 28, 2019 (JP) .............................. JP2019-215168

(51) Int. Cl.
*H01L 33/24* (2010.01)
*H01L 33/00* (2010.01)
*H01L 25/075* (2006.01)
*H01L 33/62* (2010.01)

(52) U.S. Cl.
CPC ...... *H01L 33/0095* (2013.01); *H01L 25/0753* (2013.01); *H01L 33/24* (2013.01); *H01L 33/62* (2013.01); *H01L 2933/0066* (2013.01); *H05K 2203/0278* (2013.01)

(58) Field of Classification Search
None
See application file for complete search history.

(56) References Cited

U.S. PATENT DOCUMENTS 6,264,862 B1 * 7/2001 Liaw ...................... B29C 39/10
264/102
2005/0172483 A1 8/2005 Sugita et al.
(Continued)

FOREIGN PATENT DOCUMENTS

JP 60-49698 A 3/1985
JP 7-106726 A 4/1995
(Continued)

*Primary Examiner* — Bradley Smith
(74) *Attorney, Agent, or Firm* — Birch, Stewart, Kolasch & Birch, LLP

(57) ABSTRACT

A method for manufacturing a light-emitting module includes a step of providing a bonded board including a board including, on a first surface, a circuit pattern and wiring pads that are continuous with the circuit pattern and each have bottomed holes and light-emitting segments connected on a second surface of the board with an adhesive sheet interposed therebetween and including an array of light-emitting devices; a step of supplying electrically conductive paste inside the bottomed holes and on portions of the surface of the wiring pad around the bottomed holes through openings of a mask; and a step of performing thermal compression to harden the electrically conductive paste such that the thickness of the electrically conductive paste on the portions of the surface of the wiring pad is smaller than the electrically conductive paste at the timing of being disposed through the openings of the mask.

21 Claims, 17 Drawing Sheets

(56) References Cited

U.S. PATENT DOCUMENTS

| | | | |
|---|---|---|---|
| 2012/0168206 A1* | 7/2012 | Sekine | H01L 21/486 |
| | | | 174/252 |
| 2014/0202741 A1* | 7/2014 | Okamoto | H01L 23/5389 |
| | | | 174/252 |
| 2015/0173132 A1 | 6/2015 | Chang | |
| 2018/0239193 A1 | 8/2018 | Hayashi | |
| 2019/0002741 A1 | 1/2019 | Ozeki | |
| 2019/0049649 A1 | 2/2019 | Hayashi et al. | |

FOREIGN PATENT DOCUMENTS

| | | |
|---|---|---|
| JP | 11-40943 A | 2/1999 |
| JP | 2001-203439 A | 7/2001 |
| JP | 2002-176258 A | 6/2002 |
| JP | 2003-142805 A | 5/2003 |
| JP | 2004-265607 A | 9/2004 |
| JP | 2004-265901 A | 9/2004 |
| JP | 2011-91320 A | 5/2011 |
| JP | 2011-146408 A | 7/2011 |
| JP | 2013-48300 A | 3/2013 |
| JP | 2017-175045 A | 9/2017 |
| JP | 2018-133304 A | 8/2018 |
| JP | 2019-12681 A | 1/2019 |

\* cited by examiner

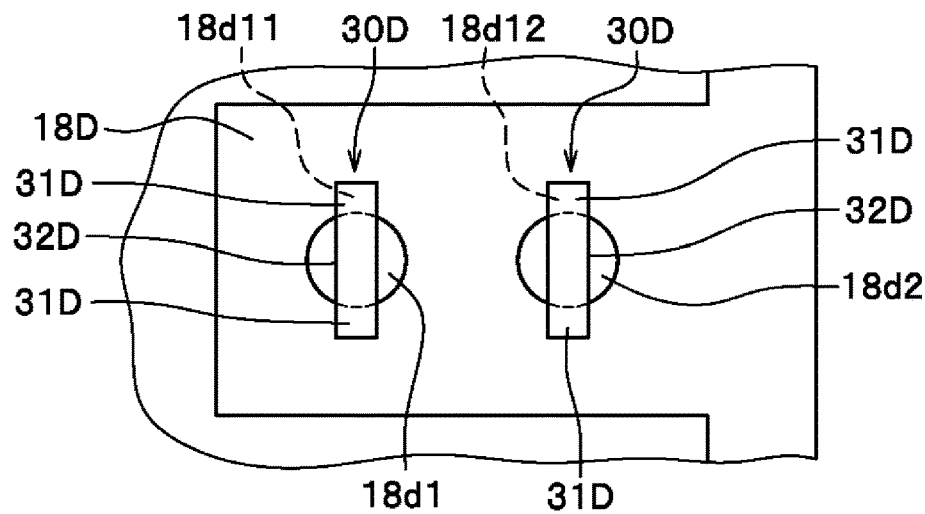
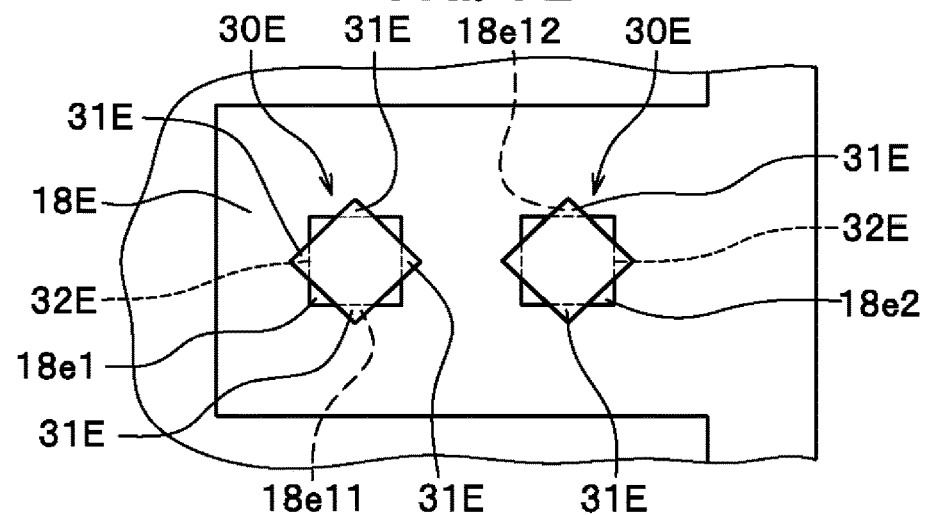
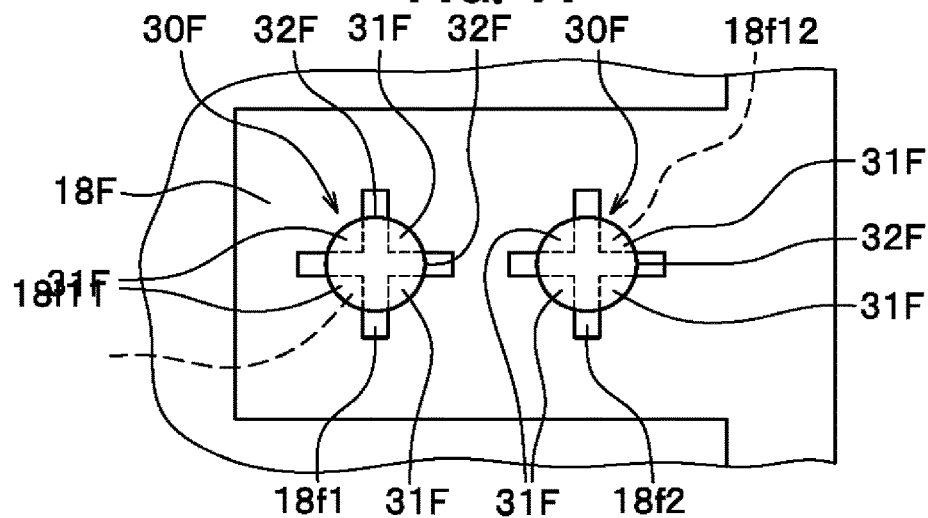

METHOD OF MANUFACTURING LIGHT-EMITTING MODULE AND LIGHT-EMITTING MODULE

CROSS-REFERENCE TO RELATED APPLICATIONS

The present application claims priority under 35 U.S.C. § 119 to Japanese Patent Application No. 2019-085494 filed on Apr. 26, 2019, and Japanese Patent Application No. 2019-215168 filed on Nov. 28, 2019, the disclosures of which are hereby incorporated by reference in their entireties.

BACKGROUND

The present disclosure relates to a method of manufacturing a light-emitting module and a light-emitting module.

Reduction in thickness or resistance has been achieved by applying pressure to a connection structure of a printed circuit board or in a method of mounting an electrical component or in a method of manufacturing a connection structure. For example, regarding a connection structure of a printed circuit board, Japanese Patent Publication No. S60-49698 discloses that solder cream is flowed into a through hole by reflow soldering. Also, Japanese Patent Publication No. 2013-48300 discloses that an electrical component is mounted by pressing and depressing a press-fitted member. In addition, Japanese Patent Publication No. 2017-175045 discloses a method of manufacturing a connection structure, the method including a thermal pressurization step in which a thermal pressurization time is set according to the viscosity of an anisotropic conductive adhesive.

SUMMARY

A method of manufacturing a light-emitting module according to an embodiment of the present disclosure includes a board having a first surface on which a circuit pattern and a bottomed hole formed in each of wiring pads continuous with the circuit pattern are provided; and a plurality of light-emitting segments connected to a second surface of the board with an adhesive sheet interposed therebetween and each comprising a plurality of light-emitting devices that are aligned; supplying electrically conductive paste into the bottomed hole through an opening of a mask while supplying the electrically conductive paste on a portion of a surface around the bottomed hole in each of the wiring pads; and performing thermal compression to the electrically conductive paste on the portion of the surface of each of the wiring pads, and hardening the electrically conductive paste such that a thickness of the electrically conductive paste on the portion is smaller than the electrically conductive paste at the timing of being disposed through the opening of the mask, and hardening the electrically conductive paste supplied into the bottomed hole.

A light-emitting module according to an embodiment of the present disclosure includes a board and a plurality of light-emitting segments. The board is provided with a circuit pattern, a plurality of bottomed holes, electrically conductive paste, and an insulating resin on a first surface. The bottomed holes are formed in each of a pair of wiring pads continuous with the circuit pattern on the first surface. The electrically conductive paste extends over two or more of the bottomed holes. The insulating resin covers the electrically conductive paste at a side close to the first surface. The light-emitting segments connected to a second surface of the board with an adhesive sheet interposed therebetween. The light-emitting segments each comprise a plurality of light-emitting devices that are aligned. The electrically conductive paste comprises a portion disposed on a portion of a surface of the wiring pad extending over two or more of the bottomed holes.

Certain embodiment of the present disclosure can provide a wiring board with high connection reliability.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 7D is a schematic enlarged top view of a third modification of the state of the bottomed holes formed in the wiring pad and the electrically conductive paste supplied into the bottomed holes of the light-emitting module according to the embodiment.

FIG. 7E is a schematic enlarged top view of a fourth modification of the state of the bottomed holes formed in the wiring pad and the electrically conductive paste supplied into the bottomed holes of the light-emitting module according to the embodiment.

FIG. 7F is a schematic enlarged top view of a fifth modification of the state of the bottomed holes formed in the wiring pad and the electrically conductive paste supplied into the bottomed holes of the light-emitting module according to the embodiment.

DESCRIPTION OF THE EMBODIMENTS

Figure 1:
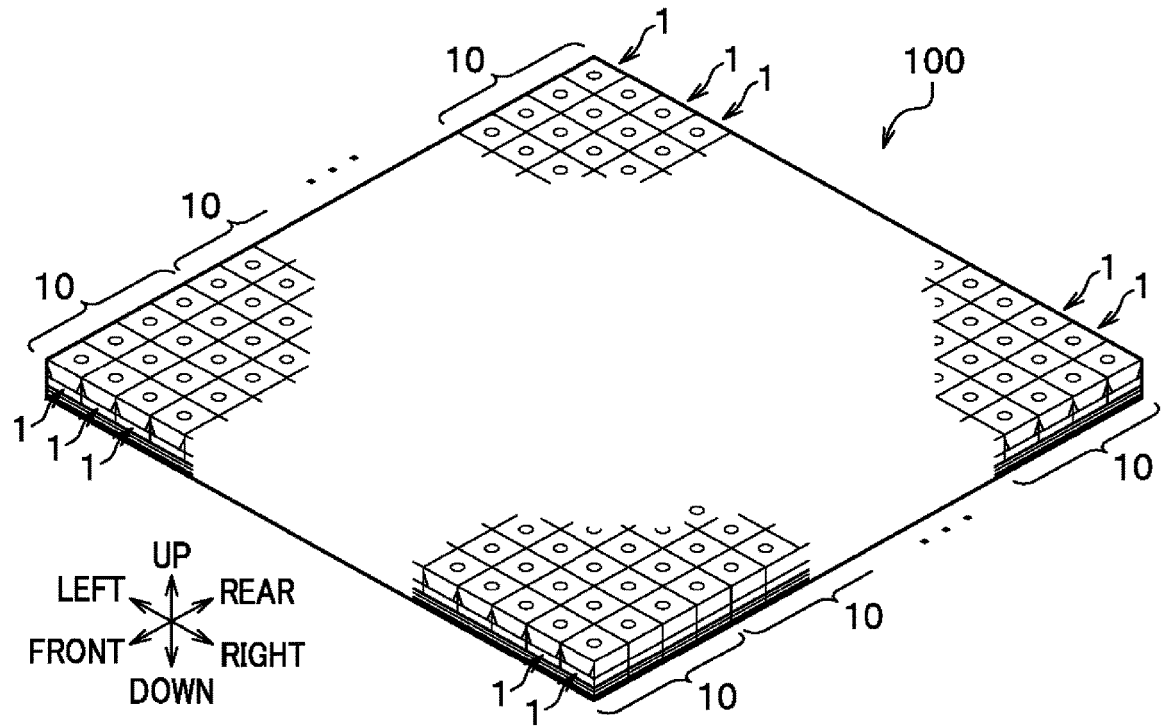
FIG. 1 is a schematic perspective view of an overall light-emitting module according to an embodiment with a portion of the light-emitting module being omitted.
Figure 2:
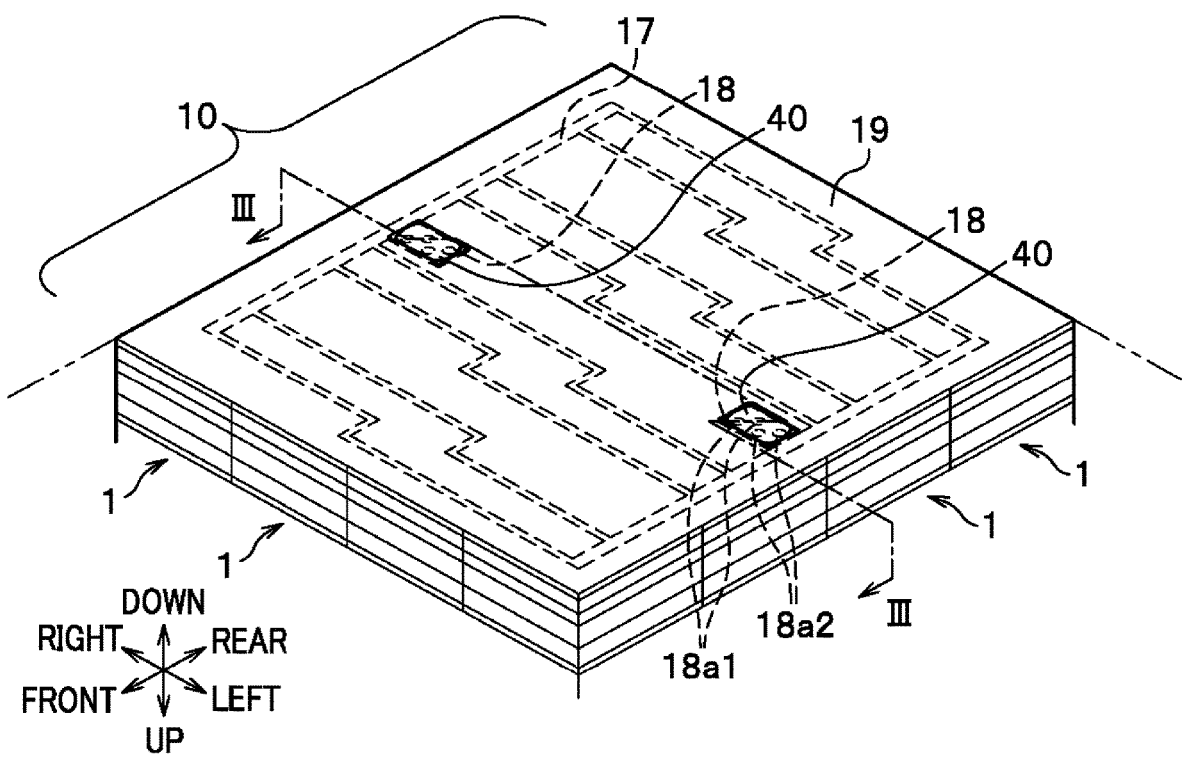
FIG. 2 is a schematic enlarged perspective view of a light-emitting segment in the light-emitting module according to the embodiment viewed from the back side.
Figure 3:
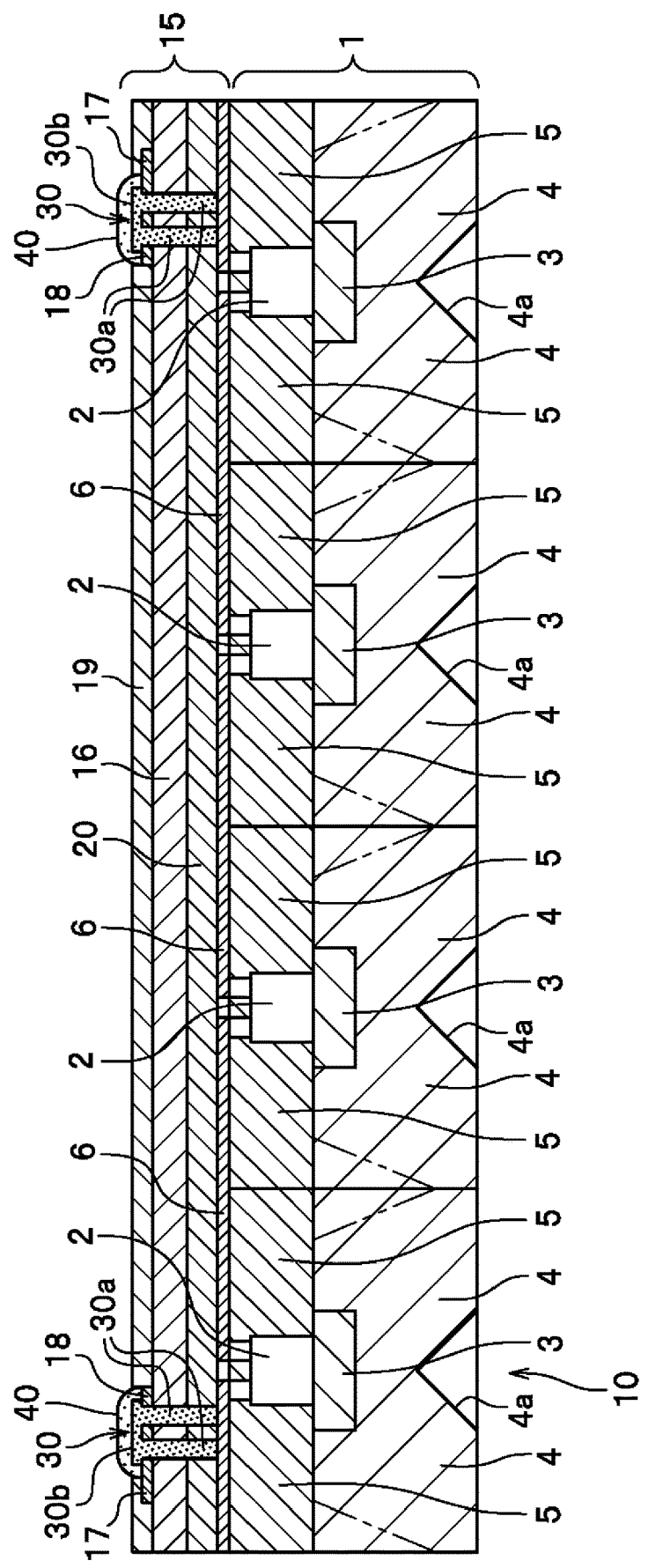
FIG. 3 is a schematic cross-sectional view of the constitution of the light-emitting segment taken along the line of FIG. 2.

The drawings referred to in the descriptions of an embodiment below schematically illustrate the present invention. The scales, the distances, the positional relationship, and the like of members can be exaggerated, or illustration of a part of a member can be omitted. Also, the scale of a member and the distance between members can be inconsistent. Further, in the descriptions below, the same term or reference numeral generally represents the same member or a substantially equivalent member, and its detailed description will be omitted as appropriate. Directions such as "up/upper", "down/lower", "left", and "right" in the constitution of a wiring board are interchangeable according to the situation. Directions such as "up/upper" and "down/lower" in the present specification are not intended to represent absolute positions unless otherwise noted but represent relative positions between components in drawings referred to for the purpose of illustration.

In the present embodiment, the constitution of a light-emitting module will be described, and then a method of manufacturing the light-emitting module will be described.

Embodiment

Light-Emitting Module

A light-emitting module 100 will be described referring to FIG. 1 to FIG. 4C.

The light-emitting module 100 includes a board 15 and a plurality of light-emitting segments 10. The board 15 is provided with, a circuit pattern 17, plurality of bottomed holes 18a1 and 18a2, electrically conductive paste 30, and an insulating resin 40 on one side (i.e., first surface side). The bottomed holes 18a1 and 18a2 (four in FIG. 2) are formed in each of a pair or set of wiring pads 18 continuous with the circuit pattern 17. The electrically conductive paste 30 extends over two or more (two in FIGS. 4B and 4C) bottomed holes 18a1 or 18a2, and an insulating resin 40 covering the electrically conductive paste 30 at the one side of the board 15.

Figure 4A:
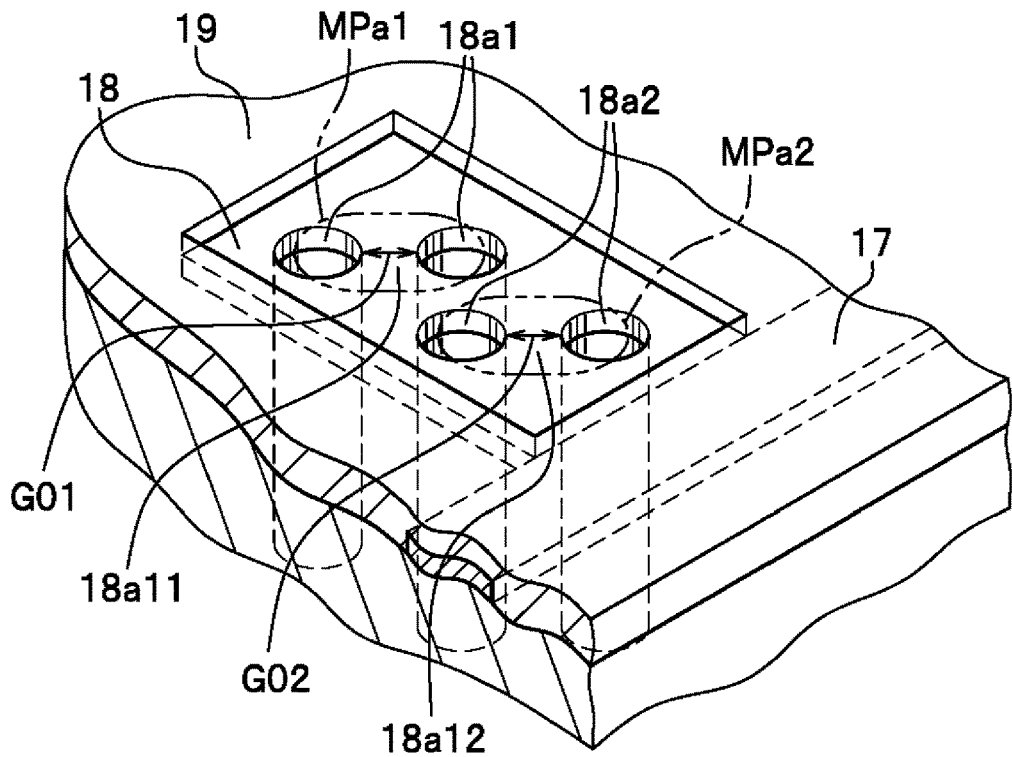
FIG. 4A is a schematic enlarged perspective view of a portion including a wiring pad formed for each light-emitting segment of the light-emitting module according to the embodiment with the other portions being omitted.
Figure 4B:
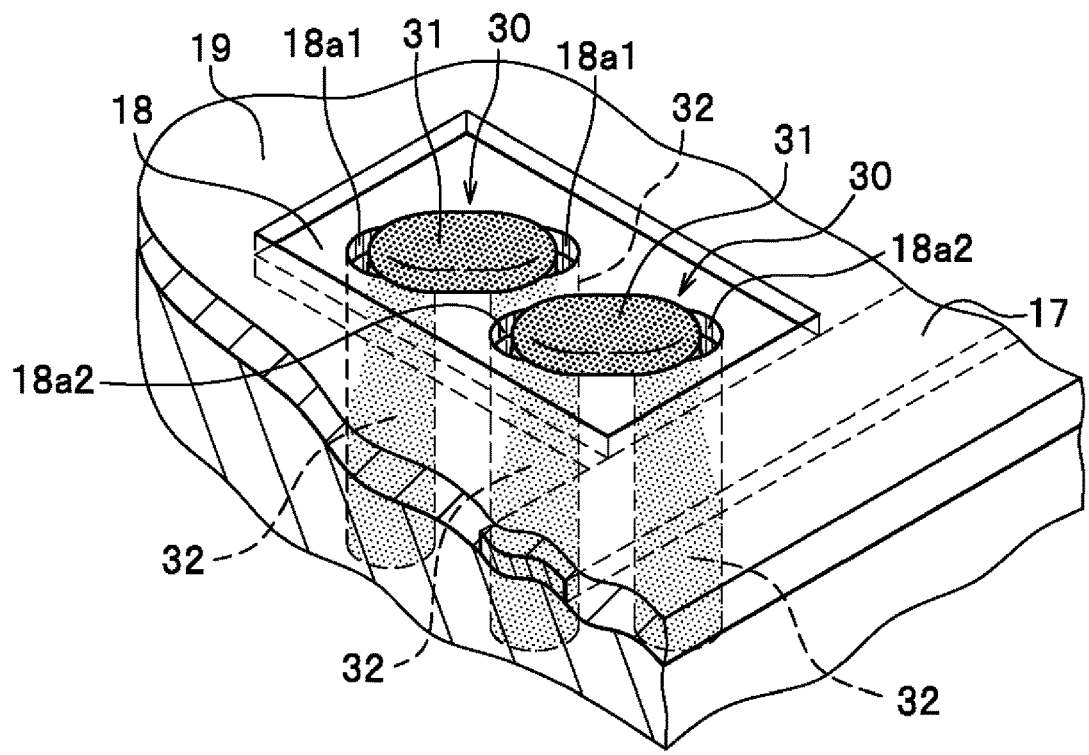
FIG. 4B is a schematic enlarged perspective view of the state in which electrically conductive paste has been supplied into bottomed holes formed in the wiring pad in FIG. 4A and hardened.
Figure 4C:
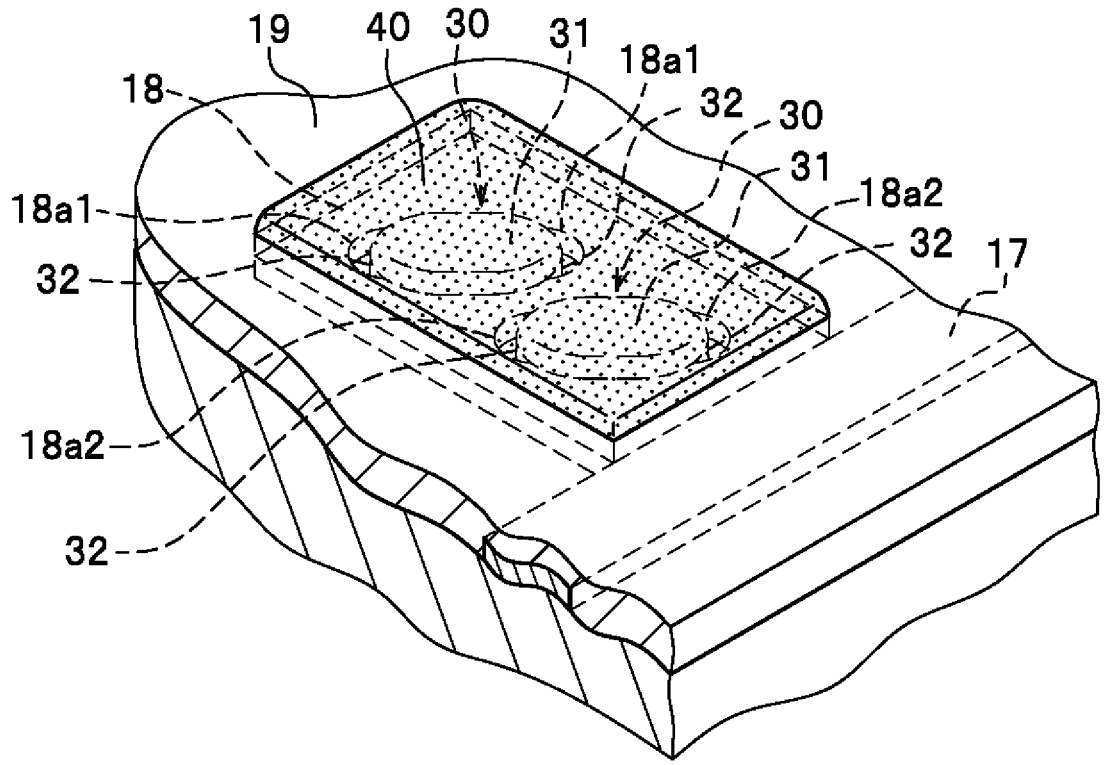
FIG. 4C is a schematic enlarged perspective view of the state in which an insulating resin is disposed on the electrically conductive paste hardened in FIG. 4B.

The light-emitting segments 10 is connected to another side (i.e., second surface side) of the board 15 with an adhesive sheet 20 interposed therebetween. The electrically conductive paste 30 forms intervening portions 31 including a portion 18a11 and a portion 18a12 as shown in FIG. 4B. The portion 18a11 extends over the two bottomed holes 18a1 in FIG. 4B to lie in a portion 18a11 of the surface of the wiring pad 18. The portion 18a12 extends over the two bottomed holes 18a2 in FIG. 4B to lie in a portion 18a12 of the surface of the wiring pad 18. The light-emitting module 100 is configured as one or more light-emitting segments aligned each in which a plurality of light-emitting devices 1 are aligned. The constitution of the light-emitting module 100 will be described below.

Board

The board 15 includes the circuit pattern 17 formed on a base member 16 and the wiring pads 18 that are continuous with the circuit pattern 17 and each have a plurality of (four in FIG. 2) bottomed holes 18a1 and 18a2. In the present embodiment, a protective sheet 19 is formed at the one side of the board 15, and the other side is bonded to a plurality of light-emitting segments 10 with the adhesive sheet 20 interposed therebetween.

The base member 16 constituting the board 15 is formed of, for example, an insulating resin material such as a phenolic resin, an epoxy resin, a polyimide resin, a BT resin, or polyphthalamide. The base member 16 can be formed of a ceramic material such as alumina or aluminum nitride. The base member 16 can have a layered structure in which an insulating member is layered on a surface of a metal member. A rigid board or a flexible board can be used for the board 15.

A metal material can be used for the circuit pattern 17 and the wiring pads 18. Suitable examples of the metal material include single-element metals such as Ag, Al, Ni, Rh, Au, Cu, Ti, Pt, Pd, Mo, Cr, and W and alloys containing these metals. Light-reflective single-element metals such as Ag, Al, Pt, and Rh and alloys containing these metals are more preferable.

For example, the pair or set of wiring pads 18 are formed continuously with the circuit pattern 17 for each light-emitting segment 10. The wiring pads 18 are, for example, rectangular regions wider than the width of wiring of the circuit pattern 17. The wiring pads 18 in the present embodiment are positioned at opposite from each other on the right and left sides of the circuit pattern at both ends of the light-emitting segment 10. The pair or set of wiring pads 18 each have, for example, two bottomed holes 18a1 and two bottomed holes 18a2. The bottomed holes 18a1 and the bottomed holes 18a2 are continuous with via holes passing through the base member 16. The diameters of the bottomed holes 18a1 and 18a2 are preferably 0.2 mm or more, more preferably 0.3 mm or more, to reduce unevenness of connection resistance and to stabilize the luminance. The aspect ratio between the diameter and the depth of each of the bottomed holes 18a1, 18a2 is preferably 0.75 or less, more preferably 0.5 or less, to facilitate supply of the electrically conductive paste 30 into the bottomed holes 18a1 and 18a2. A gap G01 between the two bottomed holes 18a1 and a gap G02 between the two bottomed holes 18a2 are preferably 0.1 mm or more and 0.5 mm or less to reduce the connection resistance.

The openings of the bottomed holes 18a1 and the bottomed holes 18a2 have shapes such as circles, ellipses, rectangles, *rhombi*, triangles, or crosses. The number of the bottomed holes formed in each of the pair or set of wiring pads 18 is at least one, in the present embodiment, the number is four but not less than two.

The two bottomed holes 18a1 and the two bottomed holes 18a2 are arranged in rows in an oblique direction relative to the direction of alignment of the light-emitting devices 1. Such arrangement of the bottomed holes 18a1 and the bottomed holes 18a2 in the oblique direction can facilitate the electrically conductive paste 30 to be easily supplied by screen printing to extend over the two bottomed holes 18a1 and over the two bottomed holes 18a2.

The electrically conductive paste 30 is supplied so as to extend over the two bottomed holes 18a1 and the two bottomed holes 18a2 to conduct electricity such that electric current from an external device is supplied to the light-emitting devices 1 aligned. The electrically conductive paste 30 is supplied into the holes from one side of the board 15 to extend over the bottomed holes 18a1 and over the bottomed holes 18a2. In other words, the electrically conductive paste 30 is supplied into the bottomed holes 18a1 and disposed on the portions 18a11 of the surface of the wiring pad 18 between the two bottomed holes 18a1. Likewise, the electrically conductive paste 30 is supplied into the bottomed holes 18a2 and disposed on the portions 18a12 of the surface of the wiring pad 18 between the two bottomed holes 18a2. The portions 18a11 and 18a12 of the surface of the wiring pad 18 are portions of the peripheries of the bottomed holes 18a1 and 18a2.

The electrically conductive paste 30 forms in-hole portions 32 positioned in the two bottomed holes 18a1 and the intervening portion 31 extending over the in-hole portions 32 to lie on the portion 18a11 of the surface of the wiring pad 18. Likewise, the electrically conductive paste 30 forms in-hole portions 32 supplied in the two bottomed holes 18a2 and the intervening portion 31 extending over the in-hole portions 32 to lie on the portion 18a12 of the surface of the wiring pad 18. The intervening portions 31 are formed in thicknesses of not more than a predetermined thickness.

The intervening portions 31 are formed by, for example, screen printing in a manufacturing method described later, and the final thicknesses of the intervening portions 31 are smaller than the thicknesses at the time of screen printing. Specifically, the intervening portions 31 preferably have thicknesses of 15 μm to 40 μm from the surface of the wiring pad 18 to reduce the thickness of the light-emitting module 100. The in-hole portions 32 is preferably fill up the bottomed holes 18a1 or the bottomed holes 18a2, but this constitution is not required as long as electrical continuity is established. The in-hole portions 32 is preferably supplied 70% or more, more preferably 80% or more or 90% or more, of the bottomed holes 18a1 or the bottomed holes 18a2.

The electrically conductive paste 30 is, for example, a mixture of a filler such as flaky, scaly, or barky silver or copper powder and a thermosetting binder resin. For the electrically conductive paste 30, a material with as small a volume resistivity as possible and small contents of the binder resin and a solvent component is preferably used.

For example, a material with a volume resistivity of $2 \times 10^{-5}$ to $1.5 \times 10^{-4}$ Ω·cm and a binder resin content of 3 mass % to 10 mass % is preferably used for the electrically conductive paste 30. Such electrically conductive paste 30 further reduces the resistance of portions in which layers are interconnected, and reduce the unevenness of the resistance. The volume resistivity is more preferably about $7.5 \times 10^{-5}$ Ω·cm, and the binder resin content is more preferably 4 mass % to 6 mass %. The solvent content of the electrically conductive paste 30 is preferably, for example, 0 mass % to 5 mass %.

For the electrically conductive paste 30, a material with low thermal contraction at the time of hardening is preferably used. Specifically, the rate of decrease of the mass at the time of hardening is preferably 5% or less. With such electrically conductive paste 30, the flatness of the intervening portions 31 is easily controlled.

Regarding a manufacturing method described later, for example, the electrically conductive paste 30 is disposed by screen printing through openings M1 of a mask MK to form the in-hole portions 32 supplied in the two bottomed holes 18a1, the in-hole portions 32 supplied in the two bottomed holes 18a2, and the intervening portions 31 extending over the corresponding in-hole portions 32 to lie on the portions 18a11 and 18a12 of the surface of the wiring pad 18. The in-hole portions 32 and the intervening portions 31 do not have to retain specific shapes in the holes or on the surface of the wiring pad when hardened as long as electrical connection can be established. The mask MK used in this process can be either a metal mask formed by processing steel use stainless (SUS) stainless steel to form openings or a screen mask made of a mesh of Tetoron (registered trademark) or SUS.

The insulating resin 40 can be formed over the electrically conductive paste 30. The insulating resin 40 protects the wiring pad 18 and the electrically conductive paste 30. The insulating resin 40 can be formed of a phenyl silicone resin, a dimethyl silicone resin, an epoxy resin, an acrylic resin, or a urethane resin. A pigment can be added to the insulating resin 40 to make the insulating resin 40 opaque.

The protective sheet 19 covers a predetermined region in a predetermined thickness to protect the circuit pattern 17 and the like disposed on the board 15. The protective sheet 19 can be formed of the same resin material as the material of the insulating resin 40. Also, a polyimide or PET film provided with an acrylic, epoxy, or urethane resin adhesive can be laminated as the protective film 19.

Light-Emitting Device and Light-Emitting Element

The light-emitting device 1 includes, for example, a light-emitting element 2, a wavelength conversion member 3 attached to the light extraction surface of the light-emitting element 2, a protective member 5 directly or indirectly disposed on the lateral surfaces of the light-emitting element 2, and a light-guiding plate 4 that is disposed on the protective member 5 and the wavelength conversion member 3 and has an optical functional portion 4a. Wiring portions 6 are formed on the surface opposite to the light-guiding plate 4 of the light-emitting device 1. A plurality of light-emitting devices 1 are aligned to constitute the light-emitting segment 10.

For example, a known semiconductor light-emitting element can be used for the light-emitting element 2, and a light-emitting diode is an example of the light-emitting element 2. For the light-emitting element 2, a light source that emits blue light can be used, or a plurality of light-emitting elements that each emit a color of light the same as or different from each other can be used to emit, for example, white light as a mixture of red, blue, and green light. An element that emits light with appropriate wavelengths can be selected for the light-emitting element 2, and the composition, emission color, size, and number of the light-emitting element can be appropriately selected according to the purpose. Examples of elements that emit blue and green light include a light-emitting element employing a nitride semiconductor ($In_xAl_yGa_{1-x-y}N$, where $0 \leq X$, $0 \leq Y$, and $X+Y \leq 1$) or GaP. A light-emitting element including a semiconductor such as GaAlAs and AlInGaP can be used as an element that emits red light. Semiconductor light-emitting elements formed of materials other than the above materials can be used, and the emission wavelengths can be selected by changing the materials for the semiconductor layers and their mixing ratios.

The wavelength conversion member 3 contains a light-transmissive material and a phosphor. The light-transmissive material is preferably formed of a material having a higher refractive index than the material of the light-guiding plate 4. A material such as an epoxy resin, a silicone resin, a mixture of these resins, and glass can be used, and it is suitable to select a silicone resin in view of resistance to light and ease of formation.

The wavelength range that can be converted by the wavelength conversion member 3 varies according to the types of the phosphor. It is therefore necessary to select an appropriate phosphor to convert desired wavelengths. Examples of the phosphor include YAG phosphors, LAG phosphors, chlorosilicate phosphors, β-SiAlON phosphors, CASN phosphors, SCASN phosphors, and fluoride phosphors such as KSF phosphors. In particular, one wavelength conversion member 3 preferably contains a plurality of types of phosphors, more preferably contains a β-SiAlON phosphor that emits green light and a fluoride phosphor, such as a KSF phosphor, that emits red light. This allows for expanding the color reproduction range of the light-emitting module.

In addition, the wavelength conversion member 3 containing a phosphor that emits light having a specific color can emit light having a specific color. The wavelength conversion member 3 can be quantum dots. A wavelength conversion material can be disposed in appropriate portions inside the wavelength conversion member 3. An effective manner can be selected from among substantially even distribution, uneven distribution, lamination of a plurality of layers each containing at least one wavelength conversion material different from each other, and the like.

A diffusing member can be disposed on the light extraction surface of the wavelength conversion member 3.

The protective member 5 protects the light-emitting element 2 and the light-guiding plate 4 and reflects light from the lateral surfaces of the light-emitting element 2 towards the light extraction surface. The protective member 5 is preferably light-reflective and is required to have a reflectance of 60% or more, preferably 90% or more, of light emitted from the light-emitting element 2. The protective member 5 having light reflectivity allows light emitted from the light-emitting element 2 to efficiently enter the light-guiding plate 4. The protective member 5 serves as both of a member protecting the light-emitting element 2 and a reflective member disposed on the surface opposite to the light exiting surface of the light-guiding plate 4. This configuration enables the light emitting module 100 to have a reduced thickness.

The protective member 5 is preferably made of a resin material containing a white pigment. To reduce the cost of the light-emitting module 100, a silicone resin containing titanium oxide, which is inexpensive, is preferably used because a comparatively large amount of the material of the protective member 5 is used to cover one surface of the light-guiding plate 4.

The light-guiding plate 4 is a light-transmissive member that receives light emitted from the light source and performs surface light emission. The light-guiding plate 4 can have a plurality of optical functional portions 4a on a first main surface serving as the light emission surface and a depressed portion accommodating the wavelength conversion member 3 on a second main surface opposite to the first main surface.

For the material of the light-guiding plate 4, a resin material such as thermoplastic resins including acrylic resins, polycarbonates, cyclic polyolefins, poly (ethylene terephthalate), and polyesters and thermosetting resins including epoxy resins and silicone resins or a light-transmissive material such as glass can be used. A thermoplastic resin material is particularly preferable because efficient manufacture by injection molding is possible, and a polycarbonate, which is highly transparent and inexpensive, is further preferable. As for the light-emitting module 100 in which the wiring portion 6 is formed after the light-emitting element 2 is mounted on the light-guiding plate 4, a thermoplastic material with low heat resistance, such as a polycarbonate, can be used because a step involving a high temperature such as reflow soldering can be omitted. The light-guiding plate 4 can be formed by, for example, injection molding or transfer molding.

The optical functional portion 4a reflects light emitted from the light-emitting element 2 to allow the light to radially spread out to uniform the emission intensity within the plane of the light-guiding plate 4. The optical functional portion 4a can be constituted by various ways such as providing a member, such as a lens, having a function of reflecting or diffusing light on the light-guiding plate 4. For example, an interface to a substance, such as air, having a refractive index different from the material of the light-guiding plate 4 can be provided. The optical functional portion 4a is an inverted circular conical depression, but its size and shape can be appropriately selected. Specifically, a depression having the shape of an inverted polygonal pyramid such as an inverted quadrangular pyramid and an inverted hexagonal pyramid is also possible. The optical functional portion 4a is a depression as described above and can reflect, in the lateral directions of the light-emitting element 2, in other words, radially from the optical functional portion 4a, light applied on the interface between a substance having a refractive index different from the light-guiding plate 4 and the inclined surface of the depression. The optical functional portion 4a can have a constitution in which a depressed portion having an inclined surface that is straight or curved in a cross-sectional view is provided with, for example, a metal reflective film or a reflective material such as a white resin. The optical functional portion 4a is preferably formed such that the optical axis passing through the center (i.e., tip of the depressed portion) of the optical functional portion 4a substantially coincides with the extension of the optical axis of the light-emitting element 2.

The wavelength conversion member 3 is bonded to the light-emitting element 2 and the light-guiding plate 4 with, for example, light-transmissive bonding members. The light-transmissive bonding member disposed between the light extraction surface of the light-emitting element 2 and the wavelength conversion member 3 preferably forms fillets on the lateral surfaces of the light-emitting element 2. The light-transmissive bonding member formed into fillets on the lateral surfaces of the light-emitting element 2 can be formed of a known adhesive such as a silicone resin.

The wiring portion 6 electrically connected to electrodes of a plurality of light-emitting elements 2 is disposed. The wiring portions 6 are formed on the protective members 5 and on the surfaces on which the electrodes of the light-emitting elements 2 are formed. The board 15 is connected to the light-emitting segments 10 with the adhesive sheet 20 interposed therebetween. Then the wiring portions 6 are connected to the electrically conductive paste 30 supplied in the via holes. Resulting in such connections, the light-emitting element 2 in the plurality of light emitting devices 1 are electrically connected to the wiring portions 6.

Figure 5:
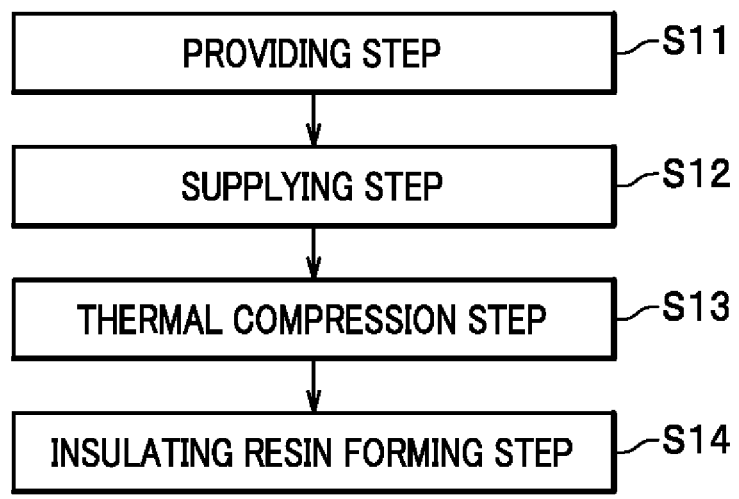
FIG. 5 is a flowchart of a method of manufacturing the light-emitting module according to the embodiment.

Next, a method of manufacturing the light-emitting module 100 described above will be described referring to FIG. 5 to FIG. 6D.

The method of manufacturing the light-emitting module includes Providing Step S11, Supplying Step S12 and Performing Thermal Compression Step S13. In Supplying Step S12, a bonded board 25 is provided. The bonded board 25 including the board 15 which has one surface (i.e., first surface) on which the circuit pattern 17 and the bottomed holes 18a1 and the bottomed holes 18a2 formed in each of the pair or set of wiring pads 18 continuous with the circuit pattern 17 are provided. A plurality of light-emitting segments 10 are connected to another surface (i.e., second surface) of the board 15 with the adhesive sheet 20 interposed therebetween and includes a plurality of light-emitting devices 1 that are aligned. In Supplying Step S12, the electrically conductive paste 30 is supplied into the bottomed holes through the openings M1 of the mask MK and the electrically conductive paste 30 is disposed on the portions 18a11 and 18a12, around the bottomed holes, of the surface of the wiring pad 18. In Performing Thermal Compression Step S13, the electrically conductive paste 30 is applied to thermal compression on the portions of the surface of the wiring pad 18, and is hardened such that the thickness of the intervening portions 31 of the electrically conductive paste 30 on the portions is smaller than the electrically conductive paste 30 at the time of being disposed through the openings M1 of the mask MK, and the electrically conductive paste 30 supplied into the bottomed holes is hardened. In Insulating Resin Forming Step S14, the insulating resin 40 covering the electrically conductive paste 30 at the one surface (i.e., first surface) of the board 15 is formed. Insulating Resin Forming Step S14 can be performed after Performing Thermal Compression Step S13. Each step is described in detail below.

In providing Step S11, a plurality of light-emitting segments 10 bonded to the board 15 with the adhesive sheet 20 interposed therebetween are provided, that is, the bonded board 25 is provided. In Providing Step S11, the board 15 is formed in which the circuit pattern 17 and the wiring pads 18 are provided on the base member 16, and the bottomed holes 18a1 and the bottomed holes 18a2 pass through the wiring pads 18 and the base member 16. The protective sheet 19 is disposed at a predetermined position on the surface of the board 15 on which the circuit pattern 17 has been formed. A portion of the adhesive sheet 20 can extend on the upper surface of the light-emitting segment 10 exposed by the bottomed holes 18a1 and 18a2 as shown in FIG. 15C described later. The other side of the board 15 is bonded to a plurality of light-emitting segments 10 with the adhesive sheet 20 interposed therebetween, each of the light-emitting segments 10 including a plurality of light-emitting devices 1 aligned. The light-emitting segments 10 include the wiring portions 6 on the bottoms of the bottomed holes 18a1 and the bottomed holes 18a2 of the wiring pads 18 to establish electrical connection of each light-emitting device 1. In Providing Step S11, the board 15 and the adhesive sheet 20 can be bonded together and then form the bottomed holes 18a1 and 18a2 by making holes at once. As an apparatus used in Providing Step S11 to combine the board 15 with the adhesive sheet 20, a hot plate press, a diaphragm type vacuum laminator, or a roll laminator can be used as appropriate.

The bottomed holes are formed through the board 15 and the adhesive sheet 20 as through holes. The through holes have the surfaces that are blocked with the wiring portions 6 of the light-emitting devices 1, the surfaces being opposite to the wiring pads 18 of the board 15, in other words, the surfaces facing the adhesive sheet 20, to constitute the bottomed holes 18a1 and 18a2. There is no difference between the through holes and the bottomed holes 18a1 and 18a2 in the shapes and properties of the portions near the openings and the inner lateral surfaces.

Figure 6A:
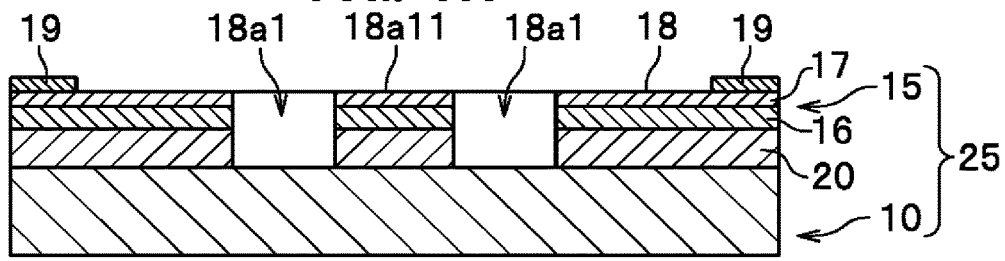
FIG. 6A is a schematic cross-sectional view of a board provided in a providing step in the method of manufacturing the light-emitting module according to the embodiment with a portion of the board being omitted.
Figure 6B:
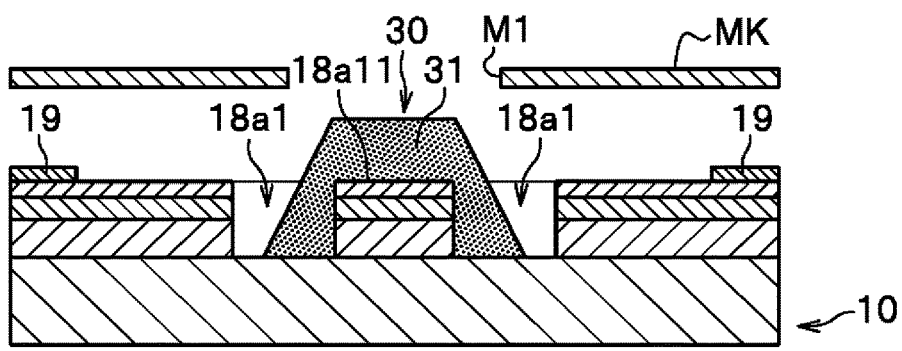
FIG. 6B is a schematic cross-sectional view of the state in which the electrically conductive paste has been supplied into the bottomed holes formed in the wiring pad in the method of manufacturing the light-emitting module according to the embodiment.

As shown in FIG. 6A, the board 15 and the light-emitting segment 10 bonded to the board 15 constitute the bonded board 25. In the bonded board 25, the through holes of the board 15 constitute the bottomed holes.

In Providing Step S11, the light-guiding plates 4 having the optical functional portions 4a formed in advance and the depressed portions to be connected to the wavelength conversion members 3 are provided. It is possible to dispose the wavelength conversion members 3 in the depressed portions of the light-guiding plates 4, bond the light extraction surfaces of the light-emitting elements 2 to the wavelength conversion members 3 with an adhesive, provide the protective members 5, and form the wiring portions 6 connecting the outer leads of the light-emitting elements 2. A step of connecting one or more light-emitting segments 10 provided with the wiring portions 6 to the board 15 with the adhesive sheet 20 interposed therebetween can be employed as Providing Step S11.

In Supplying Step S12, the electrically conductive paste 30 is supplied into the bottomed holes 18a1 and the bottomed holes 18a2 and the electrically conductive paste 30 is disposed on the portions 18a11 and 18a12 of the surfaces of the wiring pads 18. In Supplying Step S12, for example, the mask MK having the openings M1 is used. An opening M1 of the mask MK at the upper side of the bottomed holes 18a1 has, for example, an oblong shape covering a portion of each of the two bottomed holes 18a1. The oblong shape in the present embodiment refers to an annular shape having the major axis and the minor axis and including at least two curved lines. The double dot-dash lines MPa1 and MPa2 forming the oblong shapes in FIG. 4A represent projections of the openings M1 of the mask MK on the surface of the wiring pad 18. The openings M1 of the mask MK are formed to overlap with at least a portion of each bottomed hole in the wiring pads 18 and at least a portion of each portion 18a11 and each 18a12 of the surface of the wiring pad 18 as seen in a top view, so as to respectively extend over a plurality of bottomed holes 18a1 or a plurality of bottomed holes 18a2. Hence, when the electrically conductive paste is supplied while a squeegee is moved in the printing process such as screen printing, the electrically conductive paste 30 is supplied into the bottomed holes 18a1 and the bottomed holes 18a2 through the openings M1 of the mask MK and disposed on the portions 18a11 and 18a12 of the surface of the wiring pad 18. The electrically conductive paste 30 is printed to form the in-hole portions 32 formed in the bottomed holes 18a1 and the bottomed holes 18a2 and the intervening portions 31 disposed on the portions 18a11 and 18a12 of the surface of the wiring pad 18. The electrically conductive paste 30 is easily filled into the bottomed holes 18a1 and the bottomed holes 18a2 by the movement of the squeegee along the direction of alignment of the light-emitting devices 1 because the positions of the bottomed holes 18a1 and the bottomed holes 18a2 are inclined at a predetermined angle relative to the direction of alignment of the light-emitting devices 1 (or the direction along a movement of screen printing). In screen printing, the squeegee can be moved once or can be moved in toing and froing direction repeatedly.

Figure 6C:
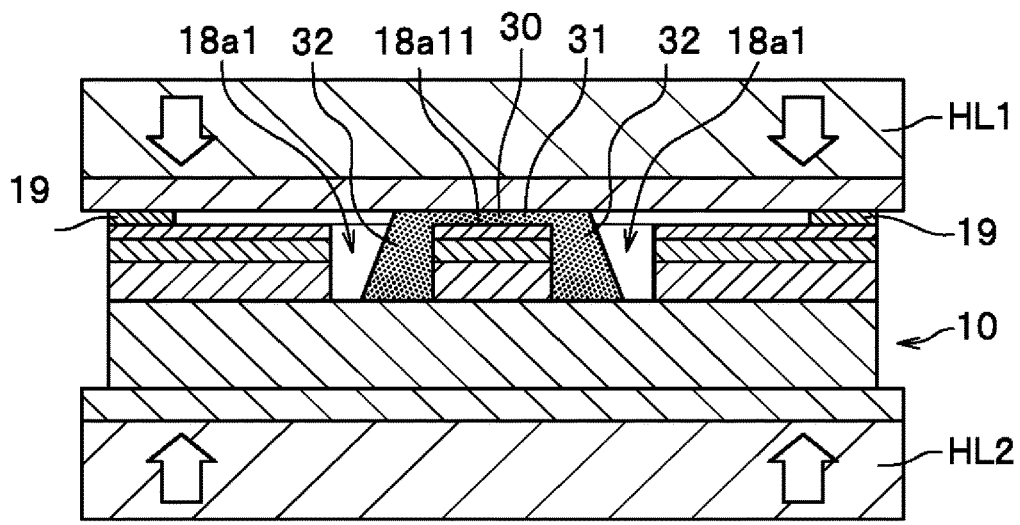
FIG. 6C schematically illustrates pressing of the electrically conductive paste using heating plates in the method of manufacturing the light-emitting module according to the embodiment.
Figure 6D:
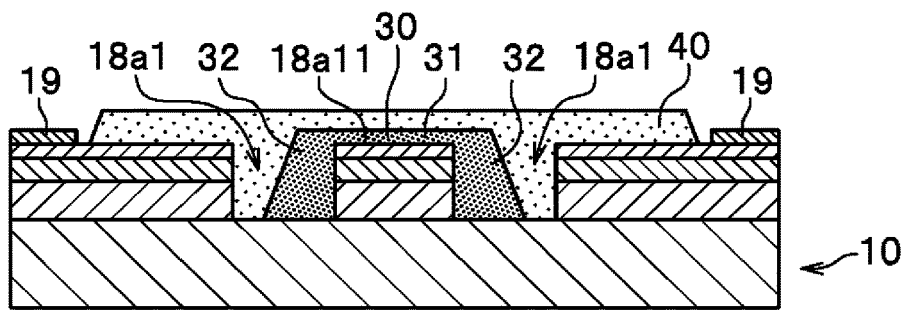
FIG. 6D schematically illustrates disposing of the insulating resin on the pressed electrically conductive paste in the method of manufacturing the light-emitting module according to the embodiment.

In Performing Thermal Compression Step S13, the intervening portions 31 of the electrically conductive paste 30 are hardened while being made thinner than the electrically conductive paste 30 at the timing of being disposed through the openings M1 of the mask MK, and the in-hole portions 32 of the electrically conductive paste 30 supplied in the bottomed holes 18a1 and the bottomed holes 18a2 are hardened as shown in FIG. 6C. In Performing Thermal Compression Step S13, for example, compression is applied while heat is applied using upper and lower heating plates HL1 and HL2 of which the temperatures can be controlled. The compression can be applied with a release film being disposed on each of the heating plates HL1 and HL2. The intervening portions 31 of the electrically conductive paste 30 are pressed to become substantially the same height as the protective sheet 19 having a predetermined height, so that the thickness of the intervening portions 31 is reduced. In Performing Thermal Compression Step S13, the intervening portions 31 are pressed with the heating plate HL1 so that the intervening portions 31 become substantially the same height as the protective sheet 19 before being hardened. The pressed electrically conductive paste 30 enters the bottomed holes 18a1 and the bottomed holes 18a2 and is hardened in this state. In Performing Thermal Compression Step S13, the thickness of the hardened intervening portions 31 of the electrically conductive paste 30 is preferably 10% to 70% of the thickness before being pressed to reduce the connection resistance, more preferably 20% to 40% in view of reduction and stability of the resistance. As an apparatus used in Performing Thermal Compression Step S13, a hot plate press, a diaphragm type vacuum laminator, or a roll laminator can be used as appropriate.

In Insulating Resin Forming Step S14, the insulating resin 40 is formed on the electrically conductive paste 30 compressed in Performing Thermal Compression Step S13. In Insulating Resin Forming Step S14, the insulating resin 40 is supplied from the one side of the board 15 to cover the wiring pad 18 and is pressed. The insulating resin 40 is formed to be higher than the protective sheet 19 and to cover the electrically conductive paste 30. If the electrically conductive paste 30 does not completely fill the bottomed holes 18a1 and the bottomed holes 18a2 and in which gaps are left, the insulating resin 40 is also supplied into the holes.

The case in which the light-emitting module 100 includes a plurality of light-emitting segments 10 aligned each of which is provided with a pair or set of wiring pads 18 has been described above, but the number of the light-emitting segments 10 can be at least one.

The intervening portions 31 of the electrically conductive paste 30 disposed on the portions of the surface of the wiring pad 18 are thin. As a result, the electric resistance and the overall thickness of the light-emitting module 100 can be reduced.

Figure 7A:
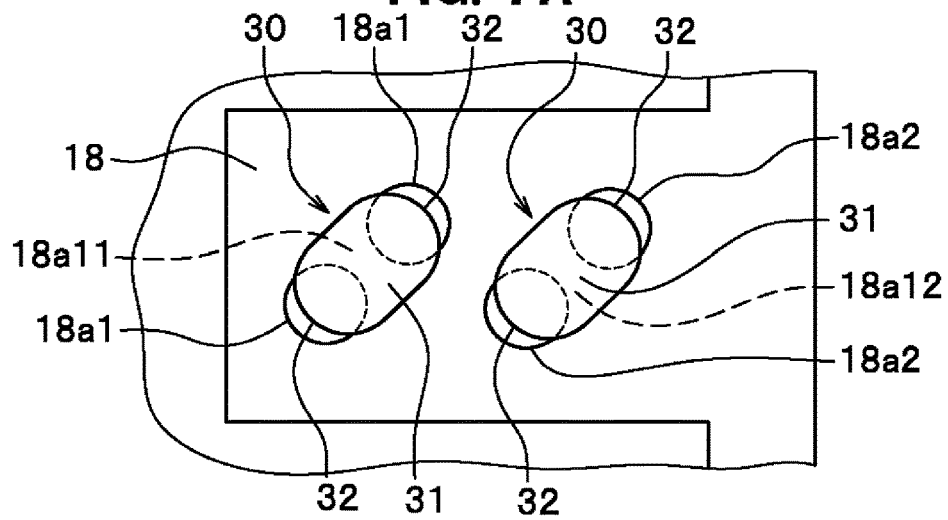
FIG. 7A is a schematic enlarged top view of the state of the bottomed holes formed in the wiring pad and the electrically conductive paste supplied into the bottomed holes of the light-emitting module according to the embodiment.

The bottomed holes 18a1 and the bottomed holes 18a2 in the wiring pad 18 and the electrically conductive paste 30 are as shown in FIG. 7A, but other constitutions as shown in FIG. 7B to FIG. 7F are also applicable. First to fifth modifications referring to FIG. 7B to FIG. 7F will be described below. The in-hole portions and the intervening portions do not have to retain specific shapes in the holes or on the surface of the wiring pad at or after the hardening, as long as electrical connection can be established. Supplying portions 32B, 32C, 32D, 32E, and 32F in FIG. 7B to FIG.

7F indicate positions equivalent to the positions indicated by the reference numeral 32 in FIG. 4B.

Figure 7B:
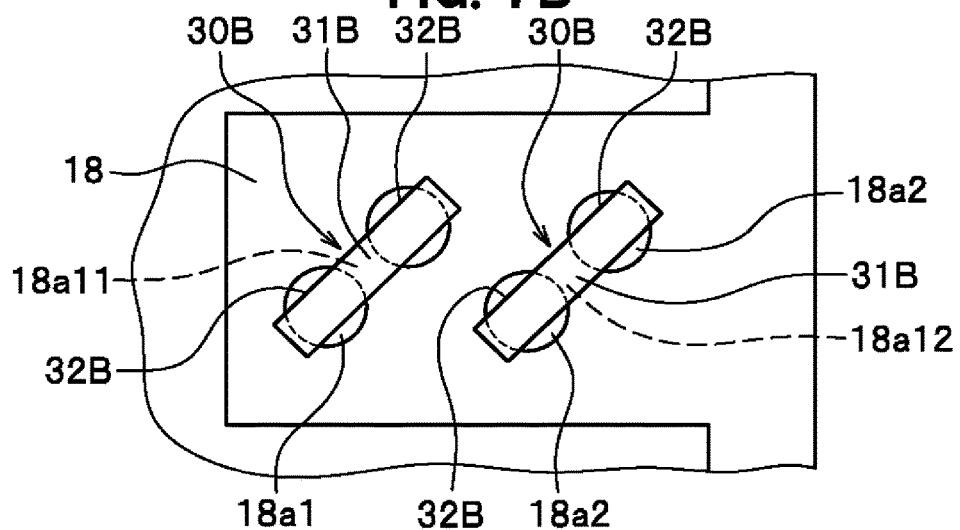
FIG. 7B is a schematic enlarged top view of a first modification of the state of the bottomed holes formed in the wiring pad and the electrically conductive paste supplied into the bottomed holes of the light-emitting module according to the embodiment.

As shown in FIG. 7B, the bottomed holes 18a1 and the bottomed holes 18a2 have the same circular shape and are arranged in the same oblique direction as those shown in FIG. 7A, and electrically conductive paste 30B is formed into an elongated rectangular shape. In other words, the openings of the mask MK have a different shape from the bottomed holes 18a1 and 18a2 in the wiring pad 18. The shape of the electrically conductive paste 30B in a top view is determined by the shape of the openings of the mask MK. The short sides of the rectangular portions of the electrically conductive paste 30B are shorter than the diameter of the bottomed holes, and the long sides of the rectangular portions are longer than the sum of the diameters of the two bottomed holes 18a1 and the dimension of the portion 18a11 of the surface of the wiring pad 18. The electrically conductive paste 30B includes intervening portions 31B extending over the two bottomed holes 18a1 across the two in-hole portions 32B formed in the bottomed holes to lie on the portions 18a11 and 18a12 of the surface of the wiring pad 18. The electrically conductive paste 30B extends farther than both in-hole portions 32B from the intervening portions 31B on the surface of the wiring pad 18 in a top view.

Figure 7C:
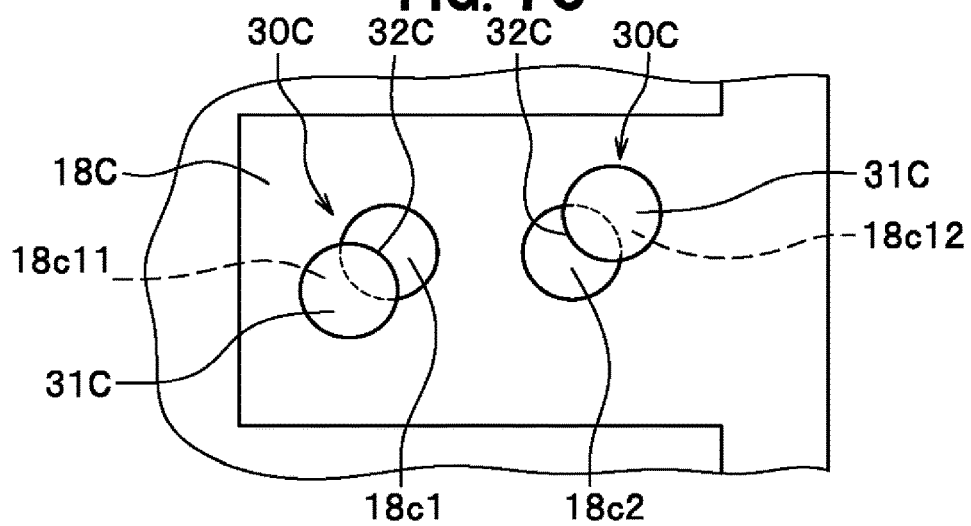
FIG. 7C is a schematic enlarged top view of a second modification of the state of the bottomed holes formed in the wiring pad and the electrically conductive paste supplied into the bottomed holes of the light-emitting module according to the embodiment.

As shown in FIG. 7C, a wiring pad 18C has bottomed holes 18c1 and 18c2. Electrically conductive paste 30C forms the in-hole portions 32C respectively formed in the bottomed holes 18c1 and 18c2 and intervening portions 31C that are continuous with the respective in-hole portions 32C and are disposed on portions of the surface of the wiring pad 18C. The shape of the combination of the in-hole portion 32C and the intervening portion 31C formed of the electrically conductive paste 30C is circular in a top view when the electrically conductive paste 30C is supplied because the opening of the mask MK used in screen printing has a circular shape. The openings of the mask MK have the same shape as the bottomed holes 18c1 and 18c2 in the wiring pad 18C and are arranged to partially overlap with and face the bottomed holes 18c1 and 18c2 such that the openings do not perfectly overlap with the bottomed holes 18c1 and 18c2 as seen in a top view.

As shown in FIG. 7D, a wiring pad 18D has bottomed holes 18d1 and 18d2. Electrically conductive paste 30D forms the in-hole portions 32D that is respectively supplied into the bottomed holes 18d1 and 18d2 and have a rectangular shape in a top view and intervening portions 31D that are continuous with the respective in-hole portions 32D and are disposed on portions of the surface of the wiring pad 18D. In other words, the openings of the mask MK have a different shape from the bottomed holes 18d1 and 18d2 in the wiring pad 18D. The shape of the combination of the in-hole portion 32D and the intervening portion 31D formed of the electrically conductive paste 30D is rectangular in a top view when the electrically conductive paste 30D is supplied because the opening of the mask MK used in screen printing has a rectangular shape. The short sides of the rectangular portions of the electrically conductive paste 30D are shorter than the diameter of the bottomed holes, and the long sides of the rectangular portions are longer than the diameter of the bottomed holes. The rectangles of the electrically conductive paste 30 when the electrically conductive paste 30 is supplied are arranged along the direction of alignment of the light-emitting devices 1 (i.e., a direction orthogonal to the direction along a movement of screen printing). The intervening portions 31D of the electrically conductive paste 30D are respectively formed on two portions 18d11 of the surface of the wiring pad 18D opposite to each other interposing the bottomed hole 18d1 therebetween, and on two portions 18d12 of the surface of the wiring pad 18D opposite to each other interposing the bottomed hole 18d2 therebetween.

As shown in FIG. 7E, a wiring pad 18E has square bottomed holes 18e1 and 18e2 in a top view along a direction parallel to the alignment direction of the light-emitting devices 1 (see FIG. 1). Electrically conductive paste 30E forms the in-hole portions 32E and intervening portions 31E through the openings of the mask MK that have the same shape as the bottomed holes 18e1 and 18e2 rotated by 45°. In other words, the openings of the mask MK have the same shape as the bottomed holes 18e1 and 18e2 in the wiring pad 18E and are arranged to partially overlap with the bottomed holes 18e1 and 18e2 such that the openings do not coincide with the bottomed holes 18c1 and 18c2. The in-hole portions 32E and the intervening portions 31E each form a square oblique at an angle of 45° relative to each of the square bottomed holes 18e1 and 18e2, and the in-hole portions 32E formed in the bottomed holes each have an octagonal shape in a top view. The intervening portions 31E on the surface of the wiring pad are formed into triangles lying along the four sides of each of the bottomed holes 18e1 and 18e2. The in-hole portions 32E do not have to retain specific shapes in the bottomed holes 18e1 and 18e2 as long as electrical connection can be established.

As shown in FIG. 7F, a wiring pad 18F has cross-shaped bottomed holes 18f1 and 18f2 in a top view. Electrically conductive paste 30F is supplied such that the combination of the in-hole portion 32F and intervening portions 31F has a circular shape in a top view. In other words, the openings of the mask MK have a different shape from the bottomed holes 18f1 and 18f2 in the wiring pad 18F. The shape of the combination of the in-hole portion 32F and the intervening portions 31F formed of the electrically conductive paste 30F is circular in a top view when the electrically conductive paste 30F is supplied because the opening of the mask MK used in screen printing has a circular shape. The circular portion of the electrically conductive paste 30F has a smaller diameter than the vertical groove and the horizontal groove of the cross shape. The circles of the electrically conductive paste 30F when the electrically conductive paste 30F is supplied are arranged along the alignment direction of the light-emitting devices 1. The intervening portions 31F of the electrically conductive paste 30F are formed at four portions 18f11 of the surface of the wiring pad 18F respectively between the horizontal groove and the vertical groove of the bottomed hole 18f1. Likewise, the intervening portions 31F of the electrically conductive paste 30F are formed at four portions 18f12 of the surface of the wiring pad 18F respectively between the horizontal groove and the vertical groove of the bottomed hole 18f1. As described above, the bottomed holes in the wiring pads and the electrically conductive paste disposed in the bottomed holes and on the portions of the surfaces of the wiring pads can have various shapes.

A modification of the openings of the mask MK will be described referring to FIG. 8A to FIG. 8C.

Figure 8A:
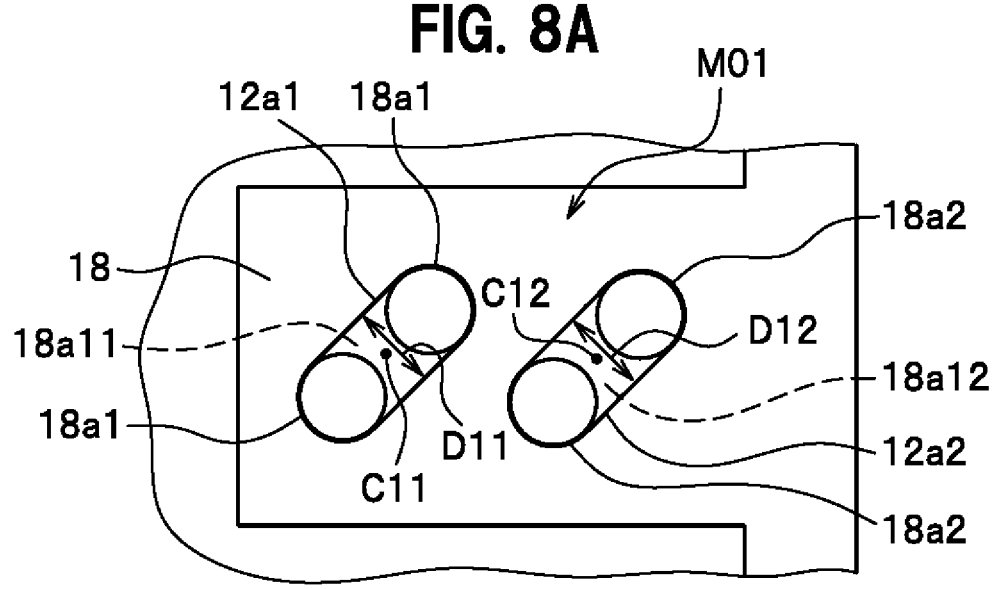
FIG. 8A is a schematic top view of the relationship between the bottomed holes and mask openings in a sixth modification.

FIG. 8A shows the relationship between the bottomed holes 18a1 and 18a2 and openings M01 of the mask MK in a sixth modification. One opening M01 of the mask MK is formed for each of the bottomed holes 18a1 and 18a2. One of the openings has an oblong shape 12a1 that encircles, in the shortest circumference, the set of bottomed holes 18a1 arranged in a row in an oblique direction in a top view. The other one of the openings has an oblong shape 12a2 that encircles, in the shortest circumference, the set of bottomed holes 18a2 arranged in a row in an oblique direction in a top view. In the sixth modification, the oblong shapes of the openings M01 in the mask MK preferably have inside diameters of 0.9 times or more and 1.1 times or less relative to the opening in the embodiment without changing the orientations or the positions of the centers of the oblong shapes in a top view.

Figure 8B:
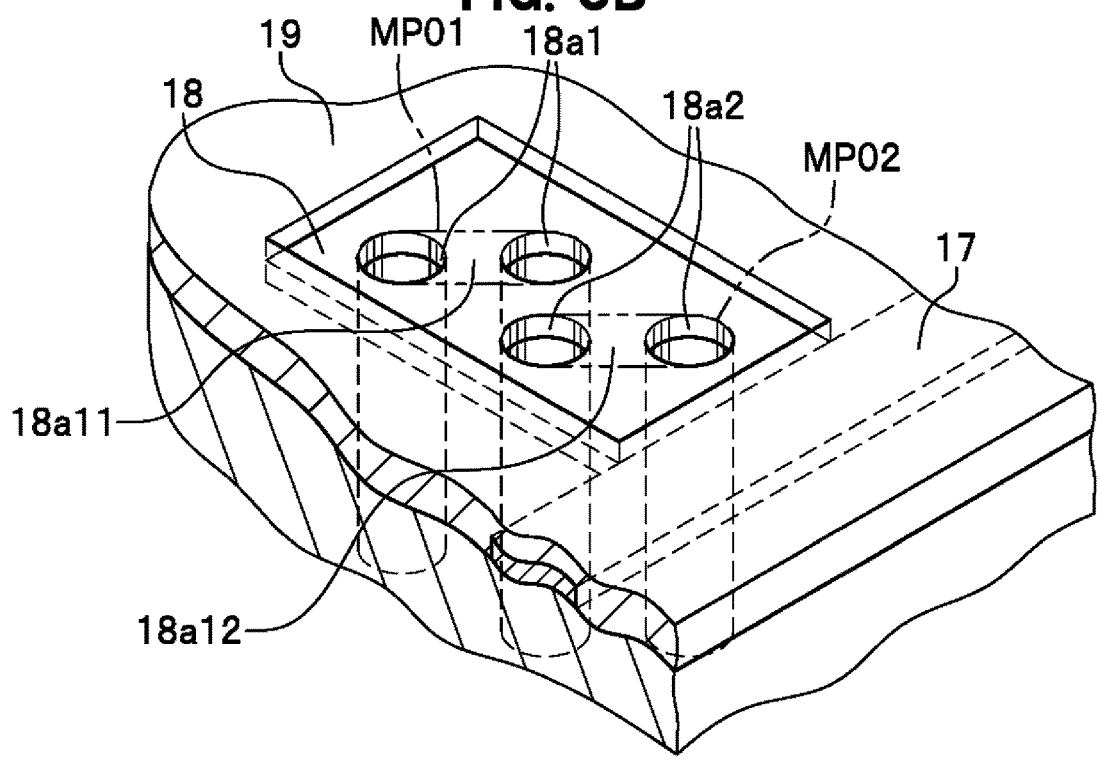
FIG. 8B is a schematic enlarged perspective view of the vicinity of the wiring pad before the electrically conductive paste is provided in the sixth modification.
Figure 8C:
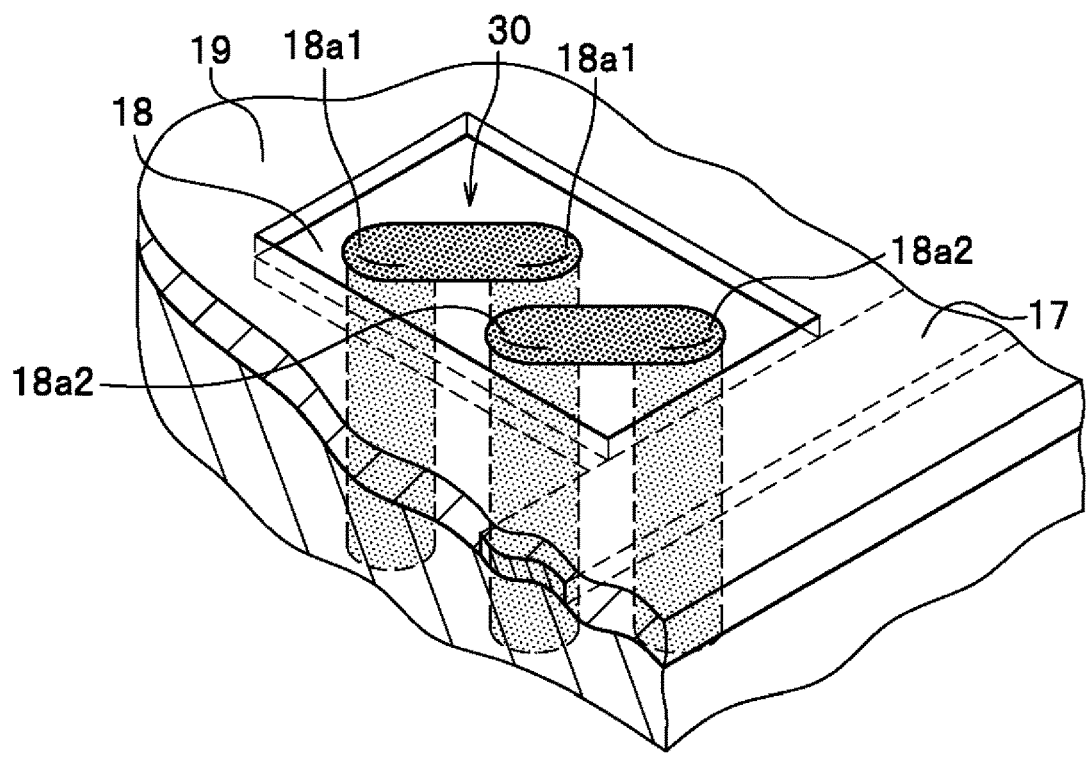
FIG. 8C is a schematic enlarged perspective view of the vicinity of the wiring pad after the electrically conductive paste is provided in the sixth modification.

FIG. 8B schematically shows the vicinity of the wiring pad 18 in the sixth modification. The double dot-dash lines MP01 and MP02 respectively encircling the bottomed holes 18a1 and the 18a2 represent projections of the openings M01 of the mask MK on the surface of the wiring pad 18. FIG. 8C shows the vicinity of the wiring pad 18 after the electrically conductive paste 30 is supplied.

FIG. 9A to FIG. 9D show several other modifications (seventh to tenth modifications). As for the seventh to tenth modifications, only the openings of the mask MK will be described to avoid redundant description of the same constitutions.

Figure 9A:
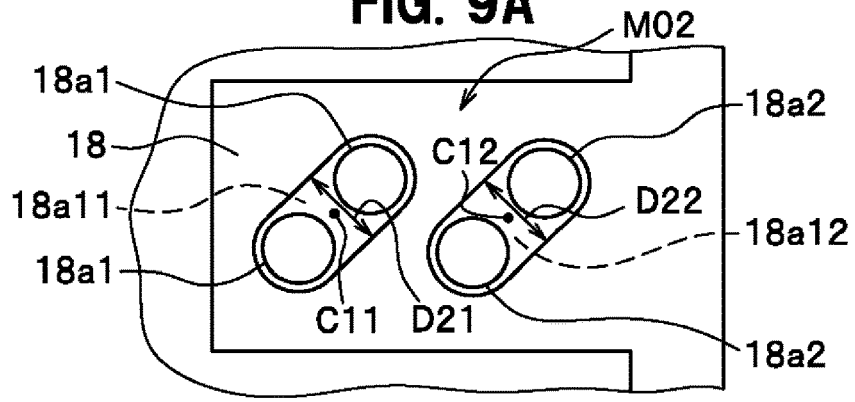
FIG. 9A is a schematic top view of the relationship between the bottomed holes and mask openings in a seventh modification.

In the seventh modification shown in FIG. 9A, openings M02 of the mask MK have inside diameters that are 1.2 times as large as inside diameters D11 and D12 of the oblong shapes 12a1 and 12a2 in the sixth modification without changing the orientations of the oblong shapes or the positions of centers C11 and C12 in a top view. The relations D21=D11×1.2 and D22=D12×1.2 are satisfied. In the seventh modification, the oblong shapes of the openings M02 in the mask MK preferably have inside diameters of 1.1 times or more and 1.3 times or less without changing the orientations or the positions of the centers of the oblong shapes in a top view.

Figure 9B:
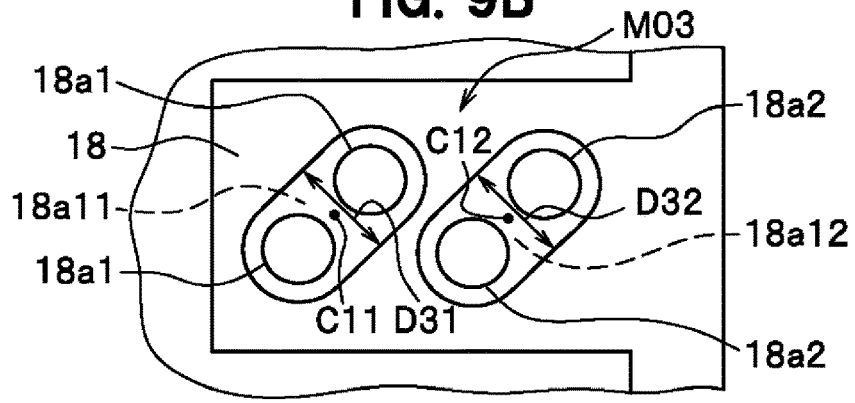
FIG. 9B is a schematic top view of the relationship between the bottomed holes and mask openings in an eighth modification.

In the eighth modification shown in FIG. 9B, openings M03 of the mask MK have inside diameters that are 1.4 times as large as the inside diameters D11 and D12 of the oblong shapes 12a1 and 12a2 in the sixth modification without changing the orientations or the positions of centers of the oblong shapes C11 and C12 in a top view. The relations D31=D11×1.4 and D32=D12×1.4 are satisfied. In the eighth modification, the oblong shapes of the openings M03 in the mask MK preferably have inside diameters of 1.3 times or more and 1.5 times or less without changing the orientations or the positions of the centers of the oblong shapes in a top view.

The value of the ratio of the inside diameters to the inside diameters D11 and D12 can be in the range of 0.9 to 1.5. That is, the oblong shapes of the openings in the mask MK can have inside diameters of 0.9 times or more and 1.5 times or less without changing the orientations or the positions of the centers of the oblong shapes in a top view.

Figure 9C:
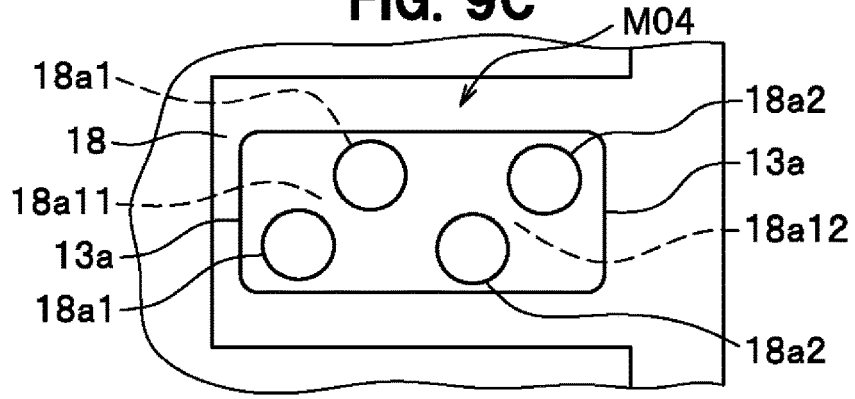
FIG. 9C is a schematic top view of the relationship between the bottomed holes and a mask opening in a ninth modification.

In the ninth modification shown in FIG. 9C, an opening M04 of the mask MK has a rectangular shape that surrounds a plurality of bottomed holes 18a1 and 18a2 formed in each wiring pad 18 in a top view and has two sides 13a parallel to the direction along a movement of screen printing.

Figure 9D:
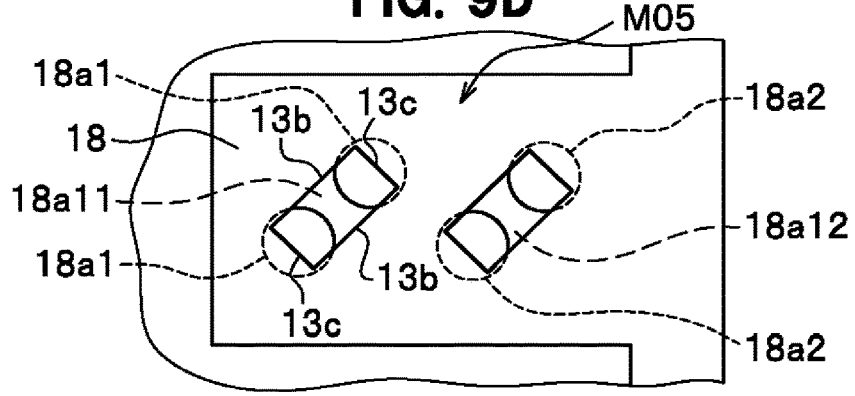
FIG. 9D is a schematic top view of the relationship between the bottomed holes and mask openings in a tenth modification.

In the tenth modification shown in FIG. 9D, the bottomed holes 18a1 (or 18a2) are configured as a set of bottomed holes arranged in a row in an oblique direction. Openings M05 of the mask MK each have a rectangular shape defined by two sides 13b substantially parallel to the oblique direction and two sides 13c respectively located inside the bottomed holes at both ends of the set of bottomed holes in a top view.

Figure 10A:
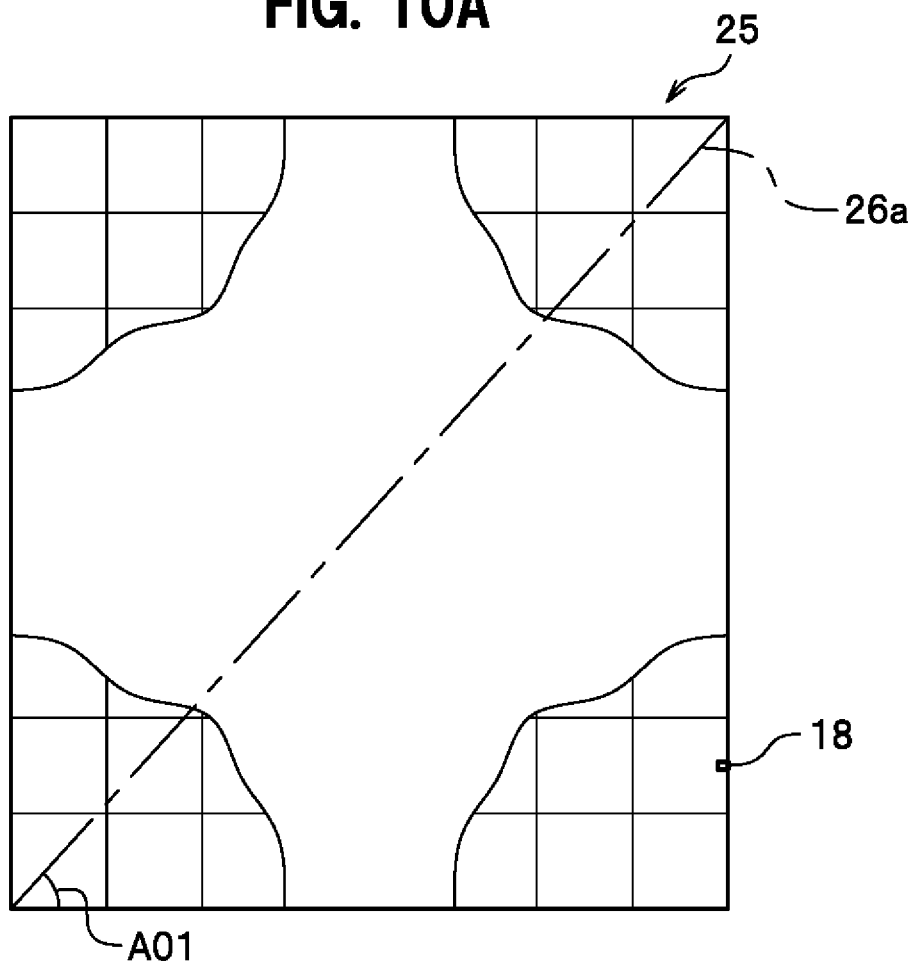
FIG. 10A is a schematic top view of an overall bonded board and schematically illustrates a diagonal line of the outer shape viewed from the wiring pad.
Figure 10B:
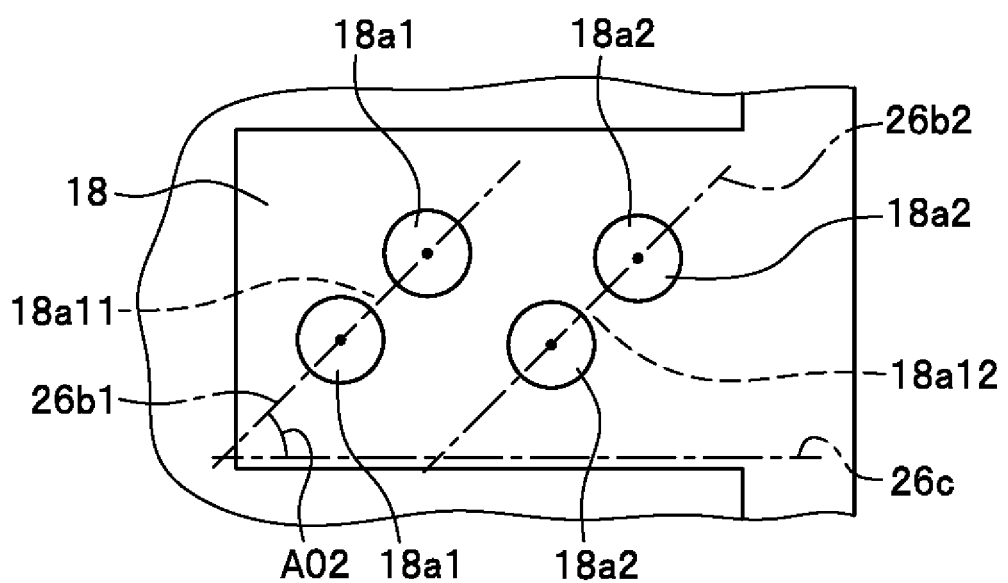
FIG. 10B is a schematic enlarged view of a portion including the wiring pad viewed in the same direction as FIG. 10A.

The oblique directions in which the bottomed holes are arranged in rows are preferably directions 26b1 and 26b2 substantially parallel to a diagonal line 26a of the bonded board 25 as shown in FIGS. 10A and 10B. This arrangement has the effect of reducing misalignment of the bottomed holes 18a1 and 18a2 due to expansion and contraction of the bonded board 25. This effect is particularly remarkable in the case in which the bonded board 25 is large. An angle A01 of the diagonal line of the bonded board 25 is 45° in the case in which the bonded board 25 has a square outer shape, and an angle A02 of inclination of the arrangement direction of the through holes or the bottomed holes, in other words, the angle between a direction 26c, which is one of the directions in which the light-emitting devices 1 and the light-emitting segments 10 are aligned, and the oblique direction 26b1 or 26b2, is also 45°.

Figure 11:
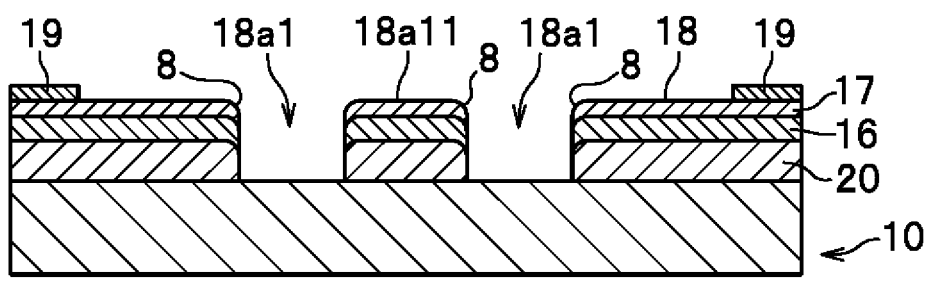
FIG. 11 is a schematic cross-sectional view of curves of the peripheries of through holes or bottomed holes formed in the wiring pad.

The peripheries of the bottomed holes 18a1 and 18a2 in the wiring pad can each have, the shapes being smoothly curved as shown in the cross-sectional view of FIG. 11. This can facilitate the electrically conductive paste 30 to flow into the holes along curves 8, and the conductive paste 30 is supplied well. In addition, the area of contact between the electrically conductive paste 30 and the wiring pad 18 becomes large, so that the connection resistance is further reduced. In synergy with Performing Thermal Compression Step S13, the connection resistance can be further reduced.

The through holes before becoming the bottomed holes can be formed by, for example, drilling or punching. In the case of employing punching, the peripheries curve in the punching direction. If the board is punched from the wiring pad 18, the curves 8 that facilitate the flow of the electrically conductive paste 30 into the holes can be formed as shown in the cross-sectional view of FIG. 11.

Figure 12A:
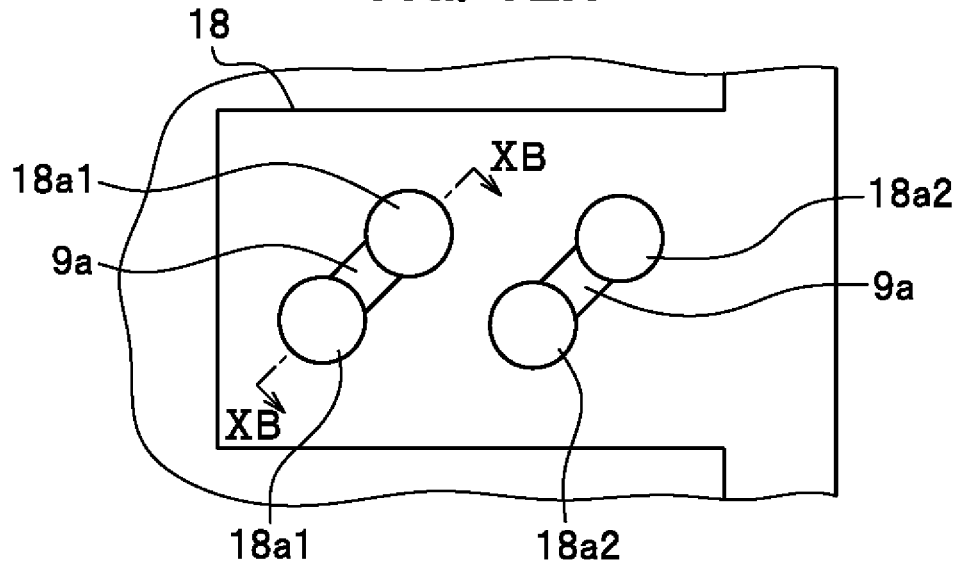
FIG. 12A is a schematic top view of illustrative depressions formed in regions connecting the bottomed holes.
Figure 12B:
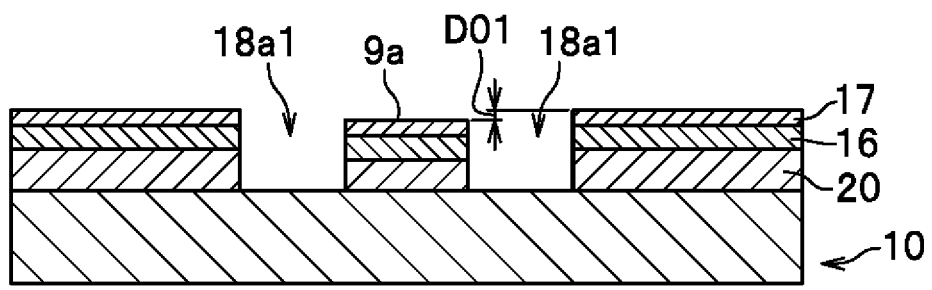
FIG. 12B is a schematic cross-sectional view for showing the depth of the depression taken along the line XB-XB of FIG. 12A.
Figure 12C:
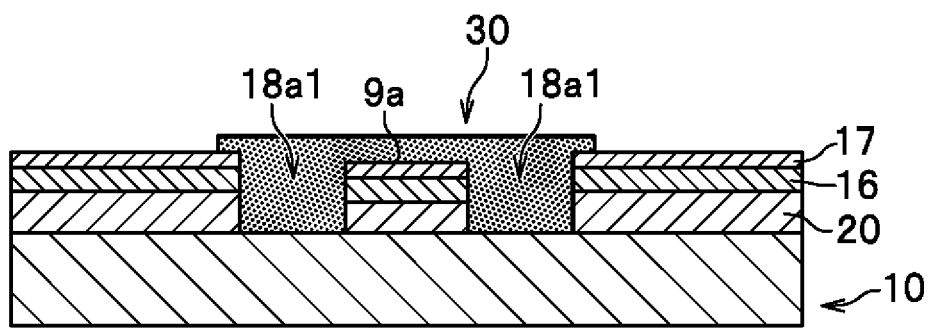
FIG. 12C is a schematic cross-sectional view of an illustrative arrangement of the electrically conductive paste in the depression and in the bottomed holes taken along the line XB-XB of FIG. 12A.
Figure 13A:
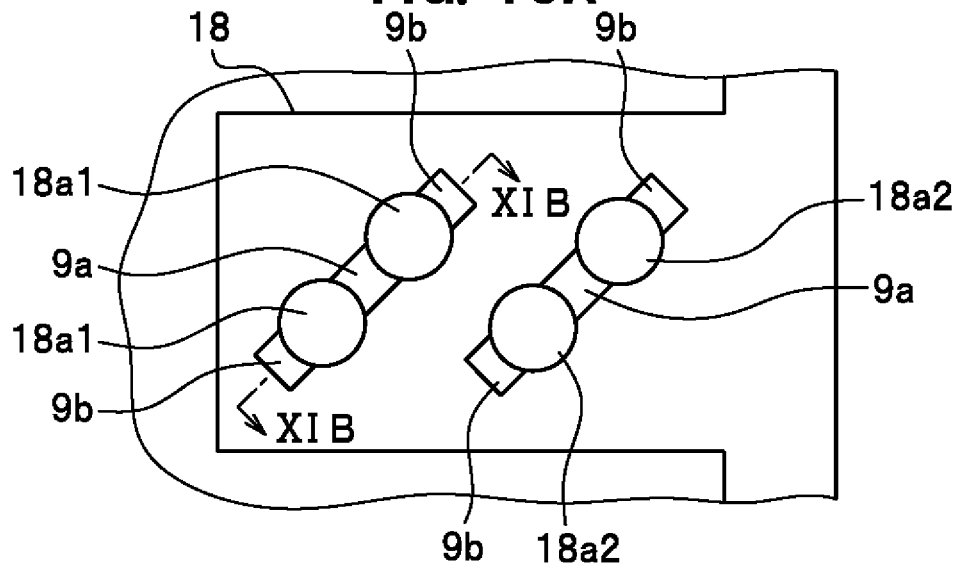
FIG. 13A is a schematic top view of illustrative depressions formed in regions not connected to other bottomed holes.
Figure 13B:
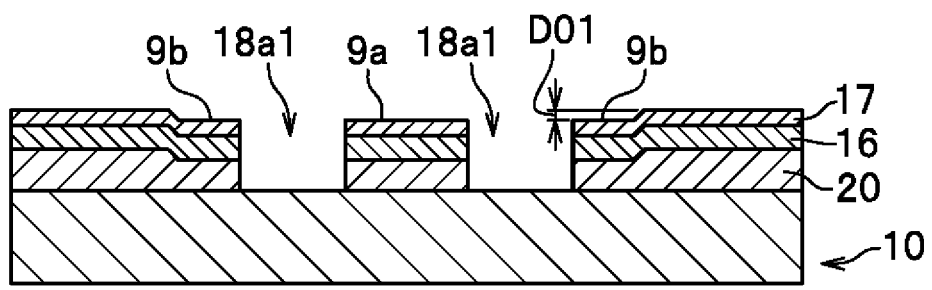
FIG. 13B is a schematic cross-sectional view for showing the depth of the depressions taken along the line XIB-XIB of FIG. 13A.
Figure 13C:
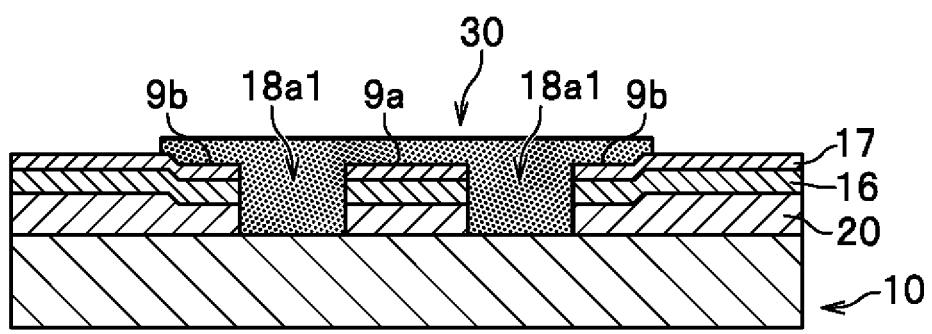
FIG. 13C is a schematic cross-sectional view of an illustrative arrangement of the electrically conductive paste in the depressions and in the bottomed holes taken along the line XIB-XIB of FIG. 13A.

If a depression 9a is formed as shown in FIG. 12A to FIG. 12C in a region connecting adjacent bottomed holes arranged in a row, the electrically conductive paste 30 can have a sufficient thickness even in the case in which the peripheries of the bottomed holes 18a1 and 18a2 are sharp, and the breakage of the electrically conductive paste 30 can be inhibited. In addition to the depression 9a, depressions 9b can be formed in regions where one of the bottomed holes sis not connected to other one of the bottomed holes as shown in FIG. 13A to FIG. 13C. Only the depressions 9b can be formed. For example, in the case of employing a flexible board in which a thickness of the metal material for the wiring pad 18 is about 20 μm, a depth(s) D01 of the depressions 9a and 9b is preferably 5 μm to 30 μm.

Figure 14A:
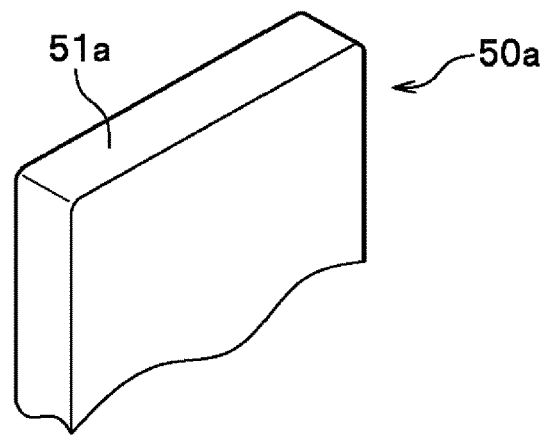
FIG. 14A is a schematic perspective view of an illustrative punch for forming the depressions.
Figure 14B:
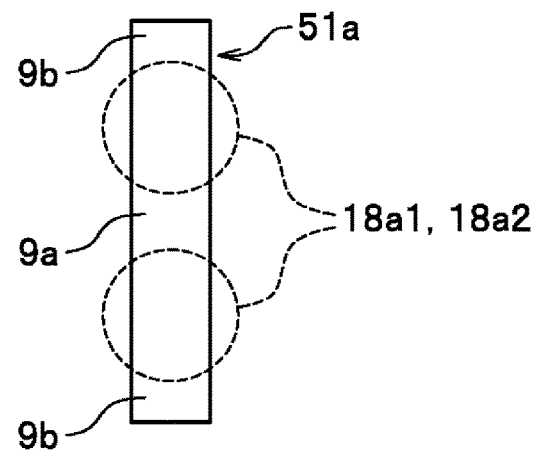
FIG. 14B is a schematic top view of the illustrative punch for forming the depressions.
Figure 14C:
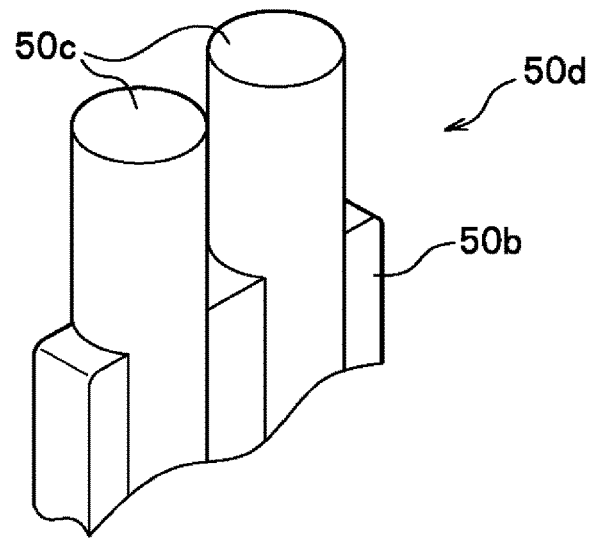
FIG. 14C is a schematic perspective view of an illustrative punch that can form both the through holes and the depressions.
Figure 14D:
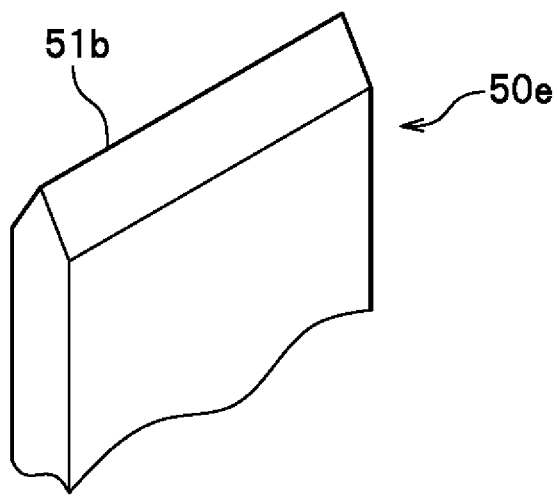
FIG. 14D is a schematic perspective view of an illustrative punch for forming V-shaped depressions.
Figure 14E:
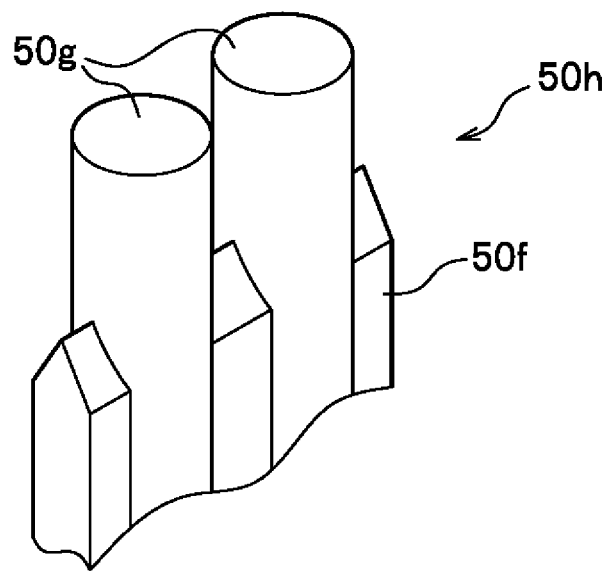
FIG. 14E is a schematic perspective view of an illustrative punch that can form both the through holes and V-shaped depressions.

The depressions 9a and 9b can be formed by, for example, punching by pushing a punch 50a having a bottom surface 51a contoured to the shapes of the depressions 9a and 9b as shown in FIGS. 14A and 14B against the wiring pad 18. Alternatively, the through holes and the depressions 9a and 9b can be formed with one punch 50d shown in FIG. 14C including depression forming portions 50b contoured to the shapes of the depressions and through hole forming portions 50c that are used for punching the through holes and are continuous with the depression forming portions 50b. The depressions 9a and 9b can be formed before the light-emitting segment 10 is bonded. In this case, the through holes and the depressions 9a and 9b can be formed by one punching motion using the punch 50d. A linear projection 51b can be provided along the longitudinal direction of the bottom surface 51a as shown in FIG. 14D. V-shaped depressions are formed by a punch 50e having the linear projection 51b, so that the electrically conductive paste 30 can have a larger thickness. In this case, a punch 50h shown in FIG. 14E including depression forming portions 50f contoured to the shapes of the depressions and through hole forming portions 50g that are used for punching the through holes and are continuous with the depression forming portions 50f can be used.

Figure 15A:
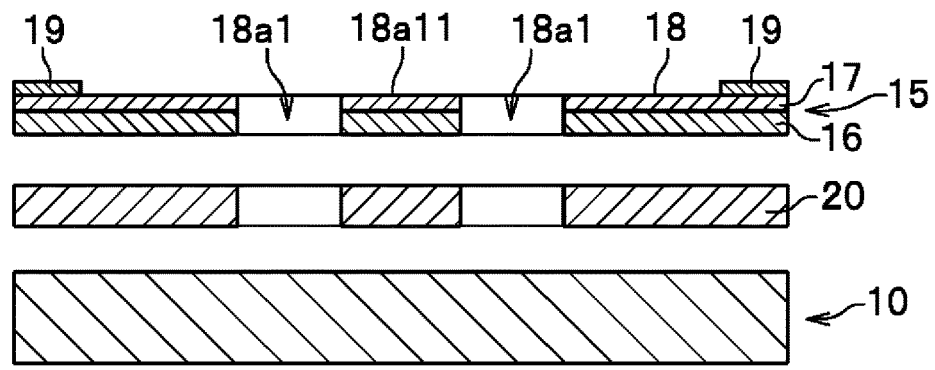
FIG. 15A schematically illustrates an adhesive sheet, the board, and the light-emitting segment in the providing step according to the embodiment.
Figure 15B:
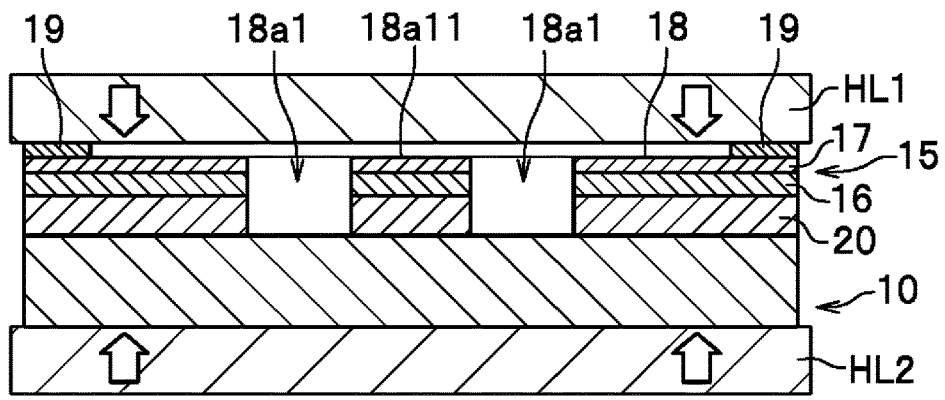
FIG. 15B schematically illustrates bonding of the board to the light-emitting segment with the adhesive sheet interposed therebetween using the heating plates in the providing step according to the embodiment.
Figure 15C:
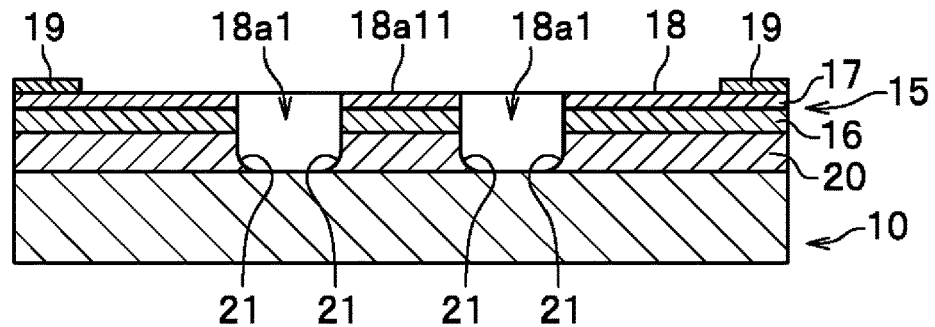
FIG. 15C schematically illustrates extending portions of the adhesive sheet formed in the bottomed holes by heat in the providing step according to the embodiment.

When the electrically conductive paste 30 is supplied into the bottomed holes, extending portions 21, which are portions of the adhesive sheet 20, can extend on the upper surface of the light-emitting segment 10 as shown in FIG. 15A to FIG. 15C. That is, the adhesive sheet 20 is disposed between the board 15 and the light-emitting segment 10, and the board 15 to the light-emitting segment 10 are bonded by pressing from above and below with the heating plates HL1 and HL2 while heat is applied as shown in FIG. 15B. The extending portions 12 of the adhesive sheet 20 extending on the light-emitting segment 10 after being heated each have a length of 10 μm or more and 1/10 or less of the diameters of the bottomed holes 18a1 and 18a2. Formation of the extending portions 21 can inhibit generation of air bubbles in the corners of the bottomed holes when the electrically conductive paste 30 is supplied. This structure is preferable also in view of the connection resistance because the length of the extending portion 12 is 1/10 or less of the diameters of the holes, so that the reliability of the light-emitting module can be improved. The flow from the adhesive sheet 20 that forms the extending portions 21 extending from the adhesive sheet 20 can be controlled as appropriate by selecting the drying conditions of the adhesive sheet and the temperature, pressure, and time of performing thermal compression. As an apparatus used in compression, a hot plate press, a diaphragm type vacuum laminator, or a roll laminator can be used as appropriate.

The invention claimed is:

1. A method of manufacturing a light-emitting module, the method comprising:
   providing a bonded board, the bonded board comprising:
      a board having a first surface on which a circuit pattern and a bottomed hole formed in each of wiring pads continuous with the circuit pattern are provided; and
      a plurality of light-emitting segments connected to a second surface of the board with an adhesive sheet interposed therebetween and each comprising a plurality of light-emitting devices that are aligned;
   supplying electrically conductive paste into the bottomed hole through an opening of a mask while supplying the electrically conductive paste on a portion of a surface around the bottomed hole in each of the wiring pads; and
   performing thermal compression to the electrically conductive paste on the portion of the surface of each of the wiring pads, and hardening the electrically conductive paste such that a thickness of the electrically conductive paste on the portion is smaller than the electrically conductive paste at the timing of being disposed through the opening of the mask, and hardening the electrically conductive paste supplied into the bottomed hole.

2. The method of manufacturing a light-emitting module according to claim 1, further comprising forming an insulating resin, to cover the electrically conductive paste on the first surface of the board after the performing thermal compression.

3. The method of manufacturing a light-emitting module according to claim 1,
   wherein the bottomed hole and at least one additional bottomed hole are formed in the each of the wiring pads, and
   wherein the opening of the mask is arranged to overlap with at least a portion of each of the bottomed holes in the wiring pads and at least a portion of the portion in the surface of each of the wiring pads as seen in a top view, so as to respectively extend over the bottomed holes in the supplying step.

4. The method of manufacturing a light-emitting module according to claim 1, wherein the opening of the mask is arranged so that at least a part of the opening of the mask overlaps with the bottomed hole and overlaps with the portion of the surface of each of the wirings pad as seen in a top view in the supplying step.

5. The method of manufacturing a light-emitting module according claim 1, wherein the opening of the mask has a different shape from a shape of each of the bottomed holes in the wiring pads.

6. The method of manufacturing a light-emitting module according to claim 1,
   wherein the opening of the mask has the same shape as each of the bottomed holes in the wiring pads, and
   wherein the opening is arranged to partially overlap with the bottomed hole such that the opening does not perfectly overlap with the bottomed hole as seen in a top view.

7. The method of manufacturing a light-emitting module according claim 1, wherein the electrically conductive paste is screen-printed in the supplying step.

8. The method of manufacturing a light-emitting module according to claim 7,
   wherein the bottomed hole and at least one additional bottomed hole are formed in each of the wiring pads, and
   wherein at least two of the bottomed holes are arranged in a row in each of the wiring pads so as to be aligned in a direction orthogonal to a direction along a movement of the screen printing.

9. The method of manufacturing a light-emitting module according to claim 8, wherein the opening of the mask has a rectangular shape surrounding a plurality of bottomed holes in each of the wiring pads in a top view and having two sides parallel to the direction along the movement of the screen printing.

10. The method of manufacturing a light-emitting module according to claim 8, wherein the wiring pad has a depression in a region connecting the adjacent bottomed holes arranged in a row.

11. The method of manufacturing a light-emitting module according to claim 10, wherein the depression is formed in a region where one of the bottomed holes is not connected to another one of the bottomed holes.

12. The method of manufacturing a light-emitting module according to claim 10,
   wherein the bottomed holes are formed by blocking an end of each of the through holes, and
   wherein the through holes and the depression are formed by one punching motion using a punch, the punch comprising:
      a depression forming portion contoured to a shape of the depression; and
      through hole forming portions used for punching the through holes and continuous with the depression forming portion.

13. The method of manufacturing a light-emitting module according to claim 7,
   wherein the bottomed hole and at least one additional bottomed hole are formed in each of the wiring pads, and
   wherein at least two of the bottomed holes are arranged in a row in each of the wiring pads so as to be arranged in an oblique direction relative to a direction along the movement of the screen printing.

14. The method of manufacturing a light-emitting module according to claim 13, wherein the oblique direction is parallel to a diagonal line of the bonded board.

15. The method of manufacturing a light-emitting module according to claim 13,
   wherein the bottomed holes are grouped in a plurality of sets of the bottomed holes arranged in a row in the oblique direction, and
   wherein the opening of the mask has a rectangular shape defined by two sides parallel to the oblique direction and two sides respectively located inside one of the set of bottomed holes at both ends of the set of bottomed holes in a top view.

16. The method of manufacturing a light-emitting module according to claim 13,
   wherein the bottomed holes are grouped in a plurality of set of the bottomed holes arranged in a row in the oblique direction, and
   wherein the opening of the mask has an oblong shape encircling, in a shortest circumference, the set of bottomed holes arranged in a row in the oblique direction in a top view.

17. The method of manufacturing a light-emitting module according to claim 16, wherein the oblong shape of the opening of the mask has an inside diameter of 0.9 times or more and 1.5 times or less without changing an orientation or a position of a center of the oblong shape in a top view.

18. The method of manufacturing a light-emitting module according to claim 13,
   wherein the wiring pads are configured as a set in each of the light-emitting segments,
   wherein four of the bottomed holes are formed in each of the wiring pads, and
   wherein two of the bottomed holes and other two of the bottomed holes are arranged in rows in the oblique direction.

19. The method of manufacturing a light-emitting module according to claim 1,
   wherein before the electrically conductive paste is supplied into the bottomed hole, the bottomed hole of the board of the provided bonded board has an inner lateral surface having at least a portion insulated from the corresponding wiring pad, and
   wherein the performing thermal compression to the electrically conductive paste on the portion of the surface of each of the wiring pads includes pressing the electrically conductive paste on the portion of the surface of each of the wiring pads with a heating plate.

20. The method of manufacturing a light-emitting module according to claim 1,
   wherein the provided bonded board further comprises a protective sheet which is disposed on the first surface of the board of provided bonded board and from which each of the wiring pads is exposed, and
   wherein the performing thermal compression to the electrically conductive paste on the portion of the surface of each of the wiring pads includes pressing the electrically conductive paste on the portion of the surface of each of the wiring pads with a heating plate so that a height of the electrically conductive paste on the portion of the surface of each of the wiring pads is reduced to a height of the protective sheet.

21. The method of manufacturing a light-emitting module according to claim 19,
   wherein the provided bonded board further comprises a protective sheet which is disposed on the first surface of the board of provided bonded board and from which each of the wiring pads is exposed, and
   wherein the performing thermal compression to the electrically conductive paste on the portion of the surface of each of the wiring pads includes pressing the electrically conductive paste on the portion of the surface of each of the wiring pads with a heating plate so that a height of the electrically conductive paste on the portion of the surface of each of the wiring pads is reduced to a height of the protective sheet.

* * * * *